(12) United States Patent
Cojocneanu et al.

(10) Patent No.: US 7,528,617 B2
(45) Date of Patent: May 5, 2009

(54) APPARATUS HAVING A MEMBER TO RECEIVE A TRAY(S) THAT HOLDS SEMICONDUCTOR DEVICES FOR TESTING

(75) Inventors: Christian O. Cojocneanu, San Jose, CA (US); Doru G. Iosub, Bucharest (RO)

(73) Assignee: Testmetrix, Inc., Sunnyvale, CA (US)

( * ) Notice: Subject to any disclaimer, the term of this patent is extended or adjusted under 35 U.S.C. 154(b) by 0 days.

(21) Appl. No.: 11/371,757

(22) Filed: Mar. 8, 2006

(65) Prior Publication Data

US 2007/0210811 A1    Sep. 13, 2007

Related U.S. Application Data

(60) Provisional application No. 60/780,330, filed on Mar. 7, 2006.

(51) Int. Cl.
  *G01R 31/02* (2006.01)
(52) U.S. Cl. .................................................. 324/754
(58) Field of Classification Search ................... None
  See application file for complete search history.

(56) References Cited

U.S. PATENT DOCUMENTS

| | | | |
|---|---|---|---|
| 4,782,291 A * | 11/1988 | Blandin ................... | 324/158.1 |
| 4,998,250 A | 3/1991 | Kohlmeier et al. | |
| 5,033,084 A | 7/1991 | Beecher | |
| 5,176,525 A | 1/1993 | Nierescher et al. | |
| 5,227,717 A * | 7/1993 | Tsurishima et al. ......... | 324/754 |
| 5,289,118 A | 2/1994 | Crisafulli | |
| 5,307,011 A * | 4/1994 | Tani ........................ | 324/158.1 |
| 5,489,852 A * | 2/1996 | Gomez ....................... | 324/754 |
| 5,635,832 A * | 6/1997 | Ito et al. .................. | 324/158.1 |
| 5,939,611 A | 8/1999 | Bolotin et al. | |
| 6,019,564 A | 2/2000 | Kiyokawa et al. | |
| 6,070,731 A | 6/2000 | Kobayashi et al. | |
| 6,074,158 A | 6/2000 | Yutaka et al. | |
| 6,075,216 A | 6/2000 | Nakamura et al. | |
| 6,104,204 A * | 8/2000 | Hayama et al. ............. | 324/760 |
| 6,135,699 A | 10/2000 | Yutaka et al. | |
| 6,137,303 A * | 10/2000 | Deckert et al. ............. | 324/765 |
| 6,184,675 B1 | 2/2001 | Bannai | |
| 6,225,798 B1 | 5/2001 | Onishi et al. | |
| 6,236,902 B1 | 5/2001 | Bolotin et al. | |
| 6,237,783 B1 | 5/2001 | Sagawa | |
| 6,248,967 B1 | 6/2001 | Nakamura | |
| 6,252,415 B1 | 6/2001 | Lefever et al. | |
| 6,259,247 B1 | 7/2001 | Bannai | |
| 6,297,464 B1 | 10/2001 | Powell et al. | |
| 6,304,073 B1 | 10/2001 | Saito | |
| 6,313,654 B1 | 11/2001 | Nansai et al. | |
| 6,320,398 B1 | 11/2001 | Ito et al. | |
| 6,339,321 B1 | 1/2002 | Yamashita et al. | |
| 6,340,266 B1 | 1/2002 | Bolotin et al. | |

(Continued)

*Primary Examiner*—Paresh Patel
(74) *Attorney, Agent, or Firm*—Owens Tarabichi LLP

(57) ABSTRACT

An apparatus for testing semiconductor devices includes a table having receptacles for trays holding semiconductor devices to be tested. An interface is positioned between the receptacles and at least one test device. The interface is customized to electrically connect the semiconductor devices to the at least one test device. The apparatus also includes a press that moves toward the table and applies force to each of the semiconductor devices, thereby securing the semiconductor devices in place for testing and securing the electrical connection to the interface.

24 Claims, 27 Drawing Sheets

U.S. PATENT DOCUMENTS

| | | | |
|---|---|---|---|
| 6,348,789 B1 * | 2/2002 | Terao | 324/158.1 |
| 6,354,792 B1 | 3/2002 | Kobayashi et al. | |
| 6,364,387 B1 | 4/2002 | Bolotin et al. | |
| 6,381,516 B1 | 4/2002 | Bolotin | |
| 6,404,181 B1 * | 6/2002 | Hikita | 324/158.1 |
| 6,406,246 B1 * | 6/2002 | Itoh et al. | 414/274 |
| 6,417,682 B1 * | 7/2002 | Suzuki et al. | 324/755 |
| 6,449,523 B1 | 9/2002 | Johson et al. | |
| 6,459,259 B1 * | 10/2002 | Ito et al. | 324/158.1 |
| 6,467,824 B2 | 10/2002 | Bolotin et al. | |
| 6,476,629 B1 * | 11/2002 | Bjork | 324/765 |
| 6,532,395 B1 | 3/2003 | Bolotin | |
| 6,535,780 B1 | 3/2003 | Anderson et al. | |
| 6,552,528 B2 | 4/2003 | Frame | |
| 6,591,486 B1 | 7/2003 | Bolotin | |
| 6,647,303 B1 | 11/2003 | Johnson et al. | |
| 6,657,426 B1 | 12/2003 | Powell et al. | |
| 6,666,365 B1 | 12/2003 | Feldman | |
| 6,671,564 B1 | 12/2003 | Johnson et al. | |
| 6,681,481 B1 | 1/2004 | Rachkov et al. | |
| 6,703,852 B1 * | 3/2004 | Feltner | 324/754 |
| 6,709,977 B2 * | 3/2004 | Contopanagos et al. | 438/666 |
| 6,732,003 B1 | 5/2004 | Bolotin | |
| 6,732,853 B1 | 5/2004 | Bolotin | |
| 6,740,998 B2 | 5/2004 | Roy | |
| 6,747,447 B2 | 6/2004 | Markert et al. | |
| 6,807,727 B2 | 10/2004 | Bolotin | |
| 6,819,099 B1 * | 11/2004 | Repko et al. | 324/158.1 |
| 6,822,436 B2 | 11/2004 | Frame | |
| 6,856,128 B2 | 2/2005 | Ito et al. | |
| 6,982,551 B2 * | 1/2006 | Yates | 324/158.1 |
| 7,154,257 B2 * | 12/2006 | Le et al. | 324/158.1 |
| 7,301,326 B1 * | 11/2007 | Green et al. | 324/158.1 |
| 7,330,025 B1 * | 2/2008 | Beach et al. | 324/158.1 |
| 2002/0166801 A1 * | 11/2002 | Tsai | 209/573 |
| 2003/0090259 A1 | 5/2003 | Frame | |
| 2003/0233749 A1 | 12/2003 | Bolotin | |
| 2004/0070416 A1 | 4/2004 | Saito et al. | |
| 2004/0262128 A1 | 12/2004 | Bolotin | |
| 2005/0040811 A1 | 2/2005 | Frame | |
| 2005/0077892 A1 | 4/2005 | Ito et al. | |
| 2007/0131881 A1 * | 6/2007 | Kim et al. | 250/559.45 |

* cited by examiner

US 7,528,617 B2

APPARATUS HAVING A MEMBER TO RECEIVE A TRAY(S) THAT HOLDS SEMICONDUCTOR DEVICES FOR TESTING

RELATED APPLICATIONS

This application claims the benefit of U.S. Provisional Application No. 60/780,330, titled "Apparatus and Method for Testing Semiconductor Devices," filed Mar. 7, 2006, the disclosure of which is hereby incorporated by reference herein.

TECHNICAL FIELD

The disclosed embodiments relate generally to equipment for testing semiconductor devices, and more particularly, to an apparatus for testing semiconductor devices in a tray for holding the semiconductor devices.

BACKGROUND

Testing is a major part of the production process for semiconductor devices, such as chips and memory modules, panels of memory modules, and printed circuit boards (PCBs). The testing stage of the semiconductor device production process identifies faulty devices and possibly entire faulty batches of devices before they reach the marketplace. The testing stage, however, can also become a bottleneck in the production process if performed inefficiently, especially for devices that require time consuming testing such as flash memory chips or modules containing flash memory chips. Thus, it is important to have a high throughput at the testing stage.

Semiconductor devices are generally carried from the production line in matrix trays, which are basically containers that hold a given number of semiconductor devices in place during transport. However, at the testing stage, they are removed from the matrix trays and inserted into sockets or the like that connect the devices to the testing equipment. After completion of the testing, the devices that passed the test are replaced into the matrix trays. This removal and replacement process takes time and decreases the testing throughput. Such a process is also expensive to implement.

Accordingly, there is a need for a more efficient semiconductor device testing apparatus.

SUMMARY

In accordance with some embodiments, an apparatus for testing a plurality of semiconductor devices includes a body comprising a first member and a movable surface opposite the first member and configured to be movable toward and away from the first member. The first member includes a first surface opposite the movable surface, a receptacle portion, and a second surface opposite the first surface. The first member defines at least one opening that extends through the first member from the first surface to the second surface. The receptacle portion is configured to receive a tray holding a plurality of semiconductor devices, each of the semiconductor devices having exposed electrical contacts, such that the exposed electrical contacts of each of the semiconductor devices would be adjacent to the at least one opening and accessible from the second surface of the body. The movable surface includes a plurality of extending members, each located at a predetermined position on the movable surface and extending a predetermined length from the movable surface, whereby when the movable surface is a predetermined distance from the first member each one of the extending members contacts a corresponding one of the semiconductor devices to secure its placement in the tray.

In accordance with some embodiments, an apparatus for testing a plurality of semiconductor devices includes means for receiving a tray holding the plurality of semiconductor devices and means for securing the plurality of semiconductor devices within the tray for testing.

In accordance with some embodiments, a method of testing a plurality of semiconductor devices includes placing a tray holding a plurality of semiconductor devices into a receptacle configured to hold the tray, contacting electrical contacts of each of the semiconductor devices with an electrical interface electrically connected to one or more test devices, applying force to each one of the semiconductor devices, thereby securing each one of the semiconductor devices in place within the tray; and performing one or more tests on each one of the semiconductor devices.

In accordance with some embodiments, a method for securing a plurality of semiconductor devices in place for testing includes placing a tray holding a plurality of semiconductor devices into a receptacle configured to hold the tray, contacting electrical contacts of each of the semiconductor devices with an electrical interface configured to be electrically connected to one or more test devices, and applying force on each one of the semiconductor devices, thereby securing each one of the semiconductor devices in place within the tray.

BRIEF DESCRIPTION OF THE DRAWINGS

Like reference numerals refer to corresponding parts throughout the drawings. It should be appreciated that the drawings are not necessarily drawn to scale and that the relative dimensions of various components in a given Figure are also not necessarily drawn to scale.

DESCRIPTION OF EMBODIMENTS

Figure 1A:
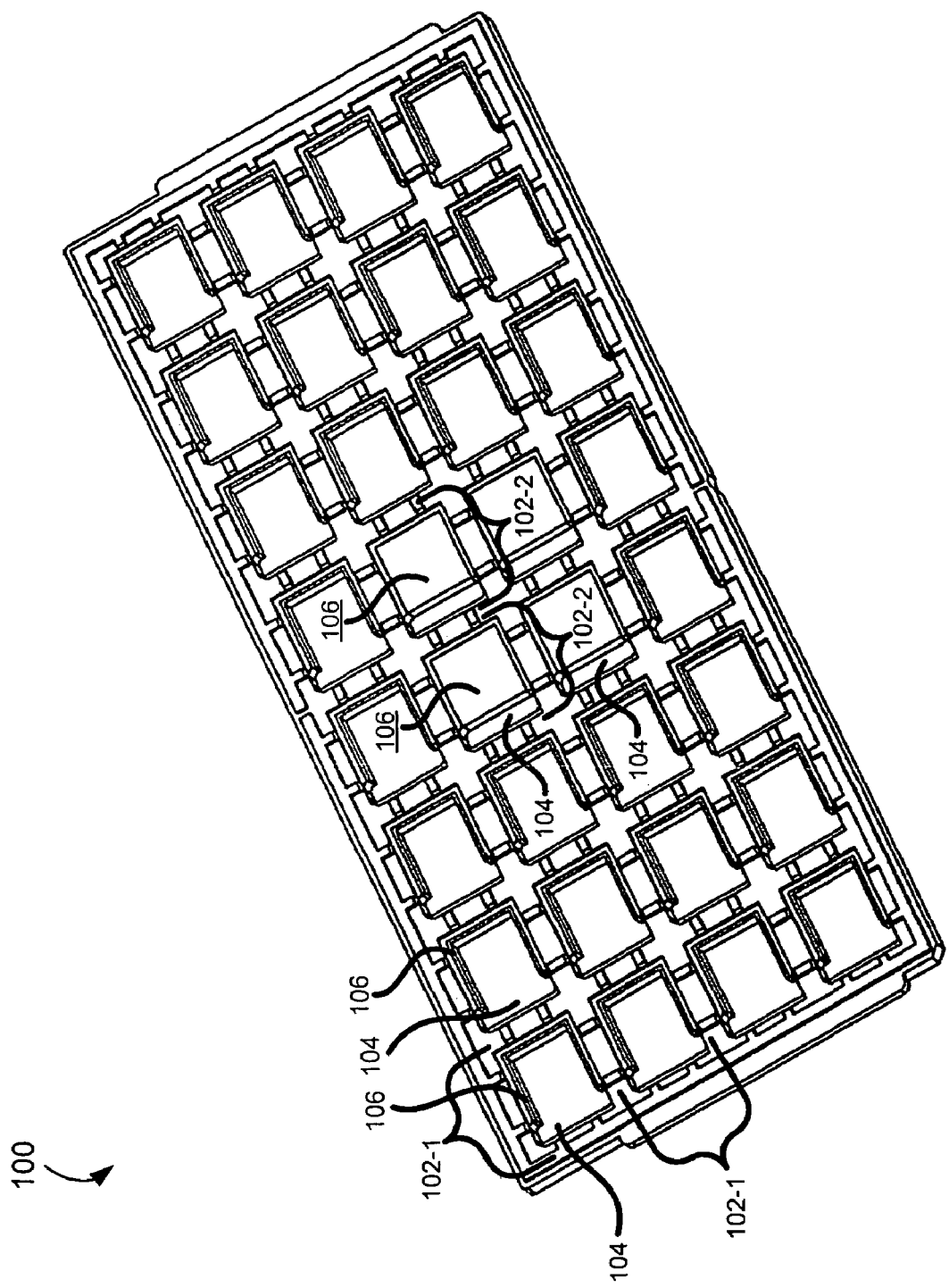
FIGS. 1A-1D illustrate an exemplary matrix tray for holding semiconductor devices in accordance with some embodiments.

In general, the following describes an apparatus and method for testing semiconductor devices. In some embodiments, the apparatus comprises a body having a surface or table having receptacle portions for separately holding trays of semiconductor devices. The trays may be standard matrix trays used to transport semiconductor devices that are configured to expose electrical contacts of each semiconductor device, for example, trays that have openings adjacent to the electrical contracts. With the trays positioned in or on the receptacle portions of the apparatus surface, openings in the surface allow access to the electrical contacts of the semiconductor devices in the tray. The apparatus also comprises a first movable pressure surface, which may include a plurality of members that extend from the movable surface, referred to as buffers, and a second movable pressure surface, moving in tandem with the first movable pressure surface. The first movable pressure surface is positioned opposite the surface holding the trays and is configured to move toward and away from the trays. The second movable pressure surface is generally positioned opposite a central area of the apparatus surface or table with the receptacle portions for holding the trays. The apparatus also comprises an interface that electrically connects the electrical contacts of the semiconductor devices to one or more test devices used to perform the desired tests on the devices or to program the devices.

In general operation, as the movable pressure surfaces move towards the apparatus surface or table holding the trays and the first movable pressure surface moves toward the tray, the buffers contact the semiconductor devices thereby applying a small amount of force onto the devices that secures each device in place within the tray. At that point the second movable pressure surface engages the central area of the apparatus surface or table holding the trays causing the movement of the entire assembly of movable pressure surfaces and the apparatus surface or table holding the trays towards the interface. When the electrical contacts of the semiconductor devices to be tested touch the interface, thereby securing the electrical connection between the electrical contacts of the devices and the interface, testing or programming operations may be performed. This provides the advantage of allowing the devices to be tested without removing them individually from the tray. Additional embodiments and corresponding features and functions are described further below in conjunction with the Figures.

Semiconductor Devices and Matrix Trays for Holding Same

The embodiments described herein are apparatuses for testing semiconductor devices. The semiconductor devices that may be tested by the disclosed embodiments include dies, chips, chip modules, chip panels, assembled printed circuit boards, memory modules, and any other type of semiconductor device that may be carried and held in matrix trays or similar containers. The semiconductor devices to be tested have electrical contacts that are exposed, for example, by extending outside of the housing of the device, or that are easily accessible within the device housing such that an electrical connection to the electrical contacts can be made. Some semiconductor devices, such as a semiconductor panel or printed circuit board, might also have dedicated electrical contacts for testing/programming purposes. In typical use, the electrical contacts of these devices are electrically connected to other devices, such as computers, in order to send data to or receive data from the respective semiconductor devices. In the embodiments described below, the exemplary semiconductor device to be carried in a matrix tray and tested is a Secure Digital (SD) memory card ("SD card"). It should be appreciated, however, that while the description below may refer to SD cards, the disclosed embodiments are not limited to testing only SD cards. The disclosed embodiments may be adapted to test a wide variety of semiconductor devices including Mini SD cards, Micro SD cards, MultiMedia Cards (MMC cards), RS-MMC cards, Micro SD cards, T-Flash, C-Flash, Memory Stick (MS) cards, MS Duo cards, and USB flash drives.

A matrix tray is a tray having a plurality of cells or compartments arranged in a matrix array pattern. An example of a matrix tray is a matrix tray that conforms to well-known standards set by the standards body known as JEDEC. A cell may serve as a receptacle for a semiconductor device. In some embodiments, some cells in a matrix tray may be configured to be locations for a tray transport device to attach to the tray, in addition to or instead of being configured as receptacles for semiconductor devices. For example, those cells may be locations where a suction-based tray transport device may grab or attach to the tray. It should be appreciated, however, that any tray or container that holds at least one semiconductor device may be used and that the tray or container may have any structure, such as a bottom and walls or simply a skeletal frame that is configured to hold semiconductor devices.

A semiconductor device is held in a matrix tray cell such that its electrical contacts are exposed (i.e., not covered by the tray structure itself or held such that the electrical contacts are accessible to allow for an external electrical connection to be made to the contacts). In some embodiments, within a cell, there may be one or more apertures or openings in the bottom of the tray that expose the electrical contacts of a semiconductor device in the cell. For example, each tray may have an opening corresponding to each one of the cells in the tray. In this case, the semiconductor device is oriented within the cell such that the electrical contacts of the semiconductor device face the aperture, protrude through the aperture, or are otherwise adjacent to the aperture. This orientation allows for access to, or an electrical connection to be made to, the electrical contacts of each of the semiconductor devices in the tray without having to remove the devices from the tray. In some other embodiments, a single aperture or opening may traverse a plurality of cells, exposing electrical contacts of a plurality of semiconductor devices that are held in those cells. The number of cells in a tray, the arrangement of the cells, and the configuration of the apertures in the cells may vary based in part on the type of semiconductor device to be carried by the tray.

Figure 1B:
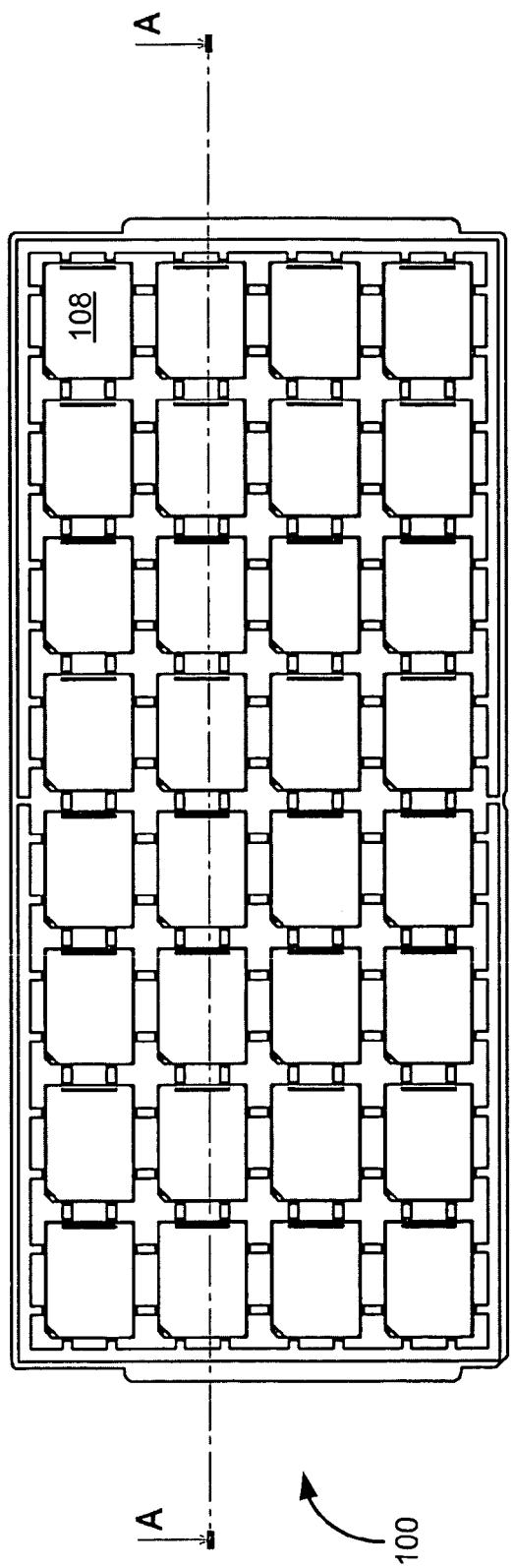
Figure 1D:
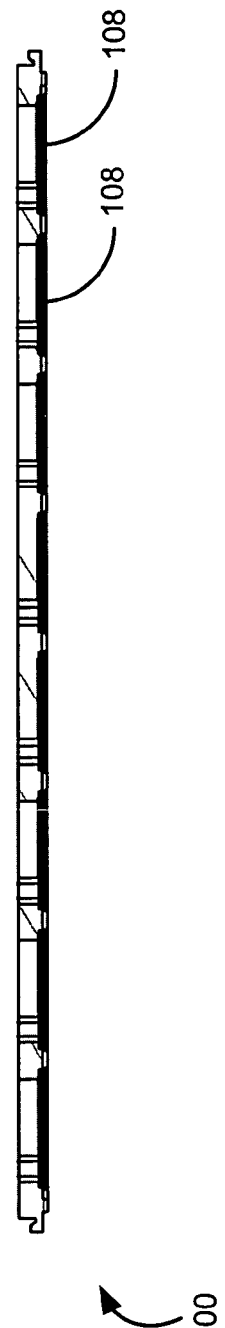
Figure 1C:
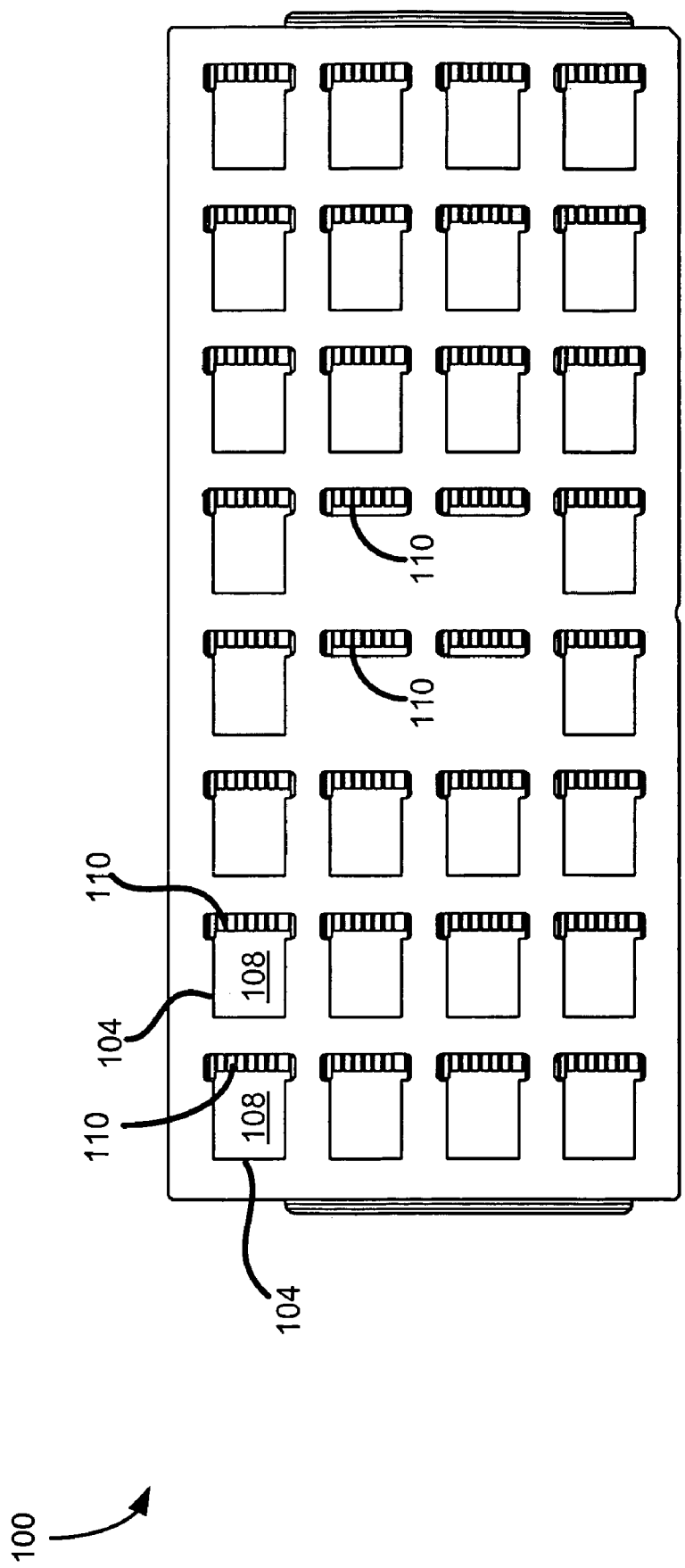

FIGS. 1A-1C illustrate an exemplary matrix tray for holding semiconductor devices in accordance with some embodiments. The exemplary matrix tray 100 as shown in FIG. 1C is configured to hold SD cards. The matrix tray 100 includes a plurality of cells 102-1, 102-2 arranged in a matrix array pattern. In matrix tray 100, cells 102-1 are configured to only hold SD cards, while cells 102-2 are configured to hold SD cards or are configured as a location where a suction-based tray transport device may attach to the tray to transport it. In some embodiments, a matrix tray may have cells that are configured only as locations where a tray transport device may attach to the tray. A tray transport device may also attach to the matrix tray 100 on the side of the tray. Each cell 102-1/102-2 may include one or more apertures 104 for exposing electrical contacts of a SD card resting in the cell 102-1/102-2 with the electrical contacts facing the aperture. Within a cell is a receptacle 106 that holds the SD card within the tray. In some embodiments, the receptacle 106 may simply be the cell structure itself such as customized or conforming walls that engage the sides of the SD card or allow the SD card to be snapped into place.

SD cards may be placed into the cells 102-1-/102-2 of the matrix tray 100 as shown in FIGS. 1B-1C. FIG. 1B illustrates a top view of the matrix tray 100 with SD cards 108 held in the cells 102-1/102-2. The SD cards 108 are placed in the cells 102-1/102-2 such that the electrical contacts 110 of the SD cards face the bottom of the matrix tray 100 and are positioned over corresponding apertures 104, whereby the electrical contacts 108 are exposed by the apertures 104. FIG. 1C illustrates a bottom view of the tray 100 with the SD cards 108 that shows the electrical contacts 110 exposed by the apertures 104. FIG. 1D illustrates a cross-section view A-A of FIG. 1B that shows the SD cards 108 in the tray 100.

Semiconductor Device Testing Apparatus

Figure 2:
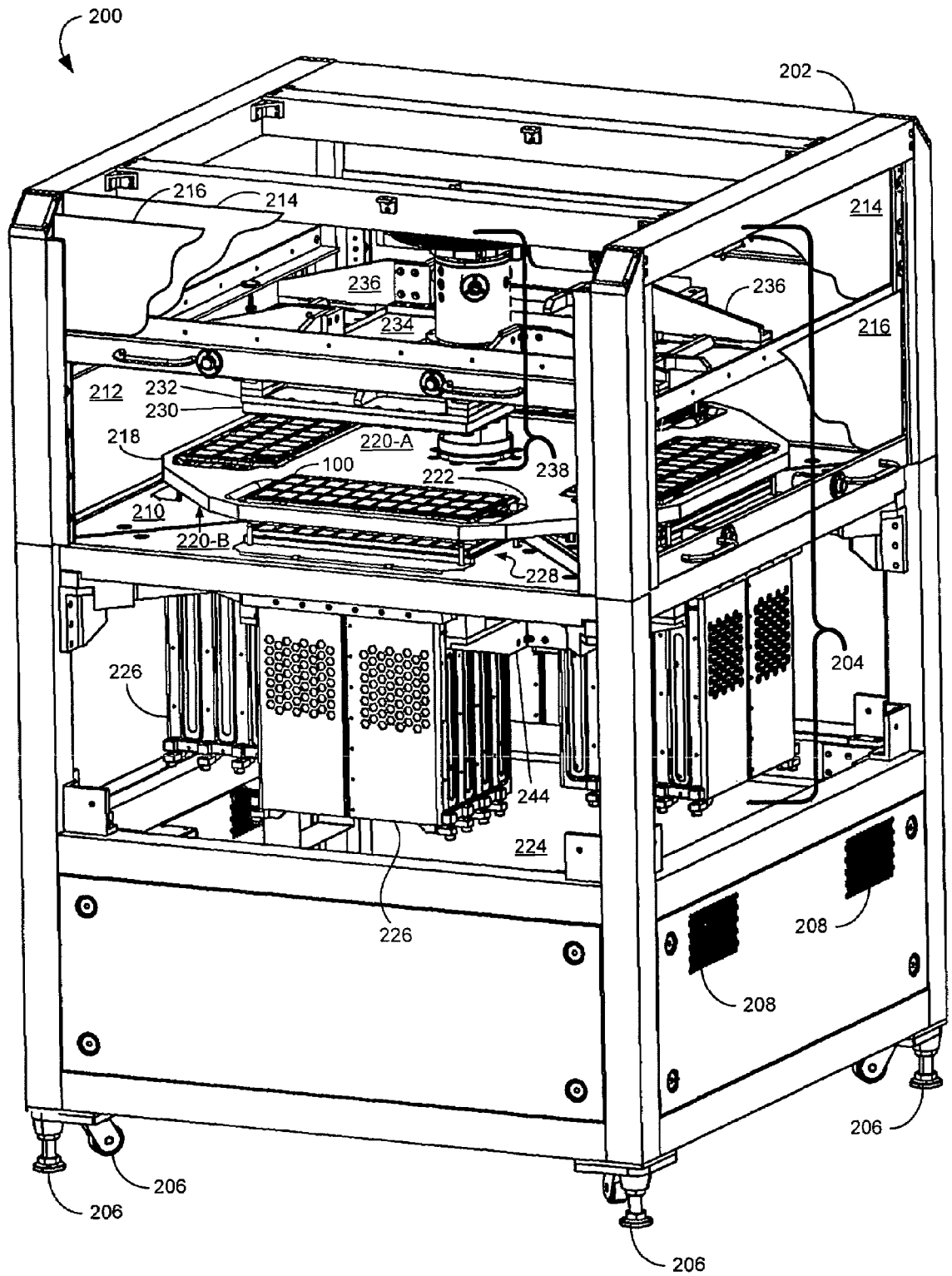
FIG. 2 illustrates a perspective view of an apparatus for testing semiconductor devices in accordance with some embodiments.

FIG. 2 illustrates a perspective view of an apparatus for testing semiconductor devices, in accordance with some embodiments. The semiconductor device testing apparatus 200 includes a body 204 surrounded and supported by a housing or chassis 202. A plurality of support members 206 may support the chassis 202. In some embodiments, the support members 206 may include legs, rollers, and/or wheels. In some embodiments, the housing 204 may also include one or more air vents 208. In some embodiments, fans or other air intake/outtake systems (not shown) may draw air into or out of the apparatus 200 via the air vents 208.

Within the apparatus 200 are at least two compartments or sections in which the body 204 resides, separated by a separator 210. A first compartment 212 is located above the separator 210. The first compartment 212 is enclosed on the sides by panels 214 and/or doors 216. In some embodiments, the doors 216 are sliding panels, with handles, that slide vertically to expose or enclose the first compartment 212. Furthermore, in some embodiments, the panels 214 and doors 216 may be translucent or transparent. For example, the doors 216 may be made of transparent glass so that users of the apparatus 200 can see from the exterior of the apparatus into the interior of the first compartment 212.

Located in the first compartment 212 is a table 218 with a first surface 220-A and a second surface 220-B. In some embodiments, the table 218 is a rotatable table, such as a turntable, that can rotate around its axis of rotation. The table 218 includes one or more openings 222 that extend through the table 218 from the first surface 220-A to the second surface 220-B and a receptacle portion for receiving and holding a tray of semiconductor devices, such as a matrix tray 100. In this embodiment an opening 222 also serves as a receptacle configured to receive a tray of semiconductor devices, such as a matrix tray 100. In some embodiments, the receptacle may be ledges or flanges on the walls of the openings 222. When held in the receptacle, parts of the tray may reside in the opening, resting on the ledges or flanges. In some embodiments, the bottom of the matrix tray, when held in the receptacle, may be flush with the second surface 220-B. In some other embodiments, the bottom of the matrix tray, when held in the receptacle, may be above or below, rather than flush with, the second surface 220-B. In other embodiments, the receptacle may be a depression in the first surface 220-A of the table 218 or may include a latching mechanism that engages the tray structure. It should be appreciated that the receptacle portion or receptacle is configured to hold the tray in the correctly aligned position such that the openings in the tray are positioned over the openings 222 in the table 218. This allows for access to, and the making of an electrical connection with, the electrical contacts of the semiconductor devices from the second surface 220-B of the table 218.

The table 218 as shown in FIG. 2 includes four openings 222 with receptacles configured to receive trays of semiconductor devices. It should be appreciated that the table 218 may include more or less openings 222. For example, in some other embodiments, the table 218 may have two, three, five, six, seven, or eight openings. In other embodiments, the table 218 may have a plurality of openings that correspond to the number of openings in a given tray. In this case, if the table 218 is configured to have a certain number of receptacles for trays, each portion of the table 218 adjacent to each receptacle would have a plurality of openings corresponding to each of the openings in the tray. Accordingly, the receptacle may be configured to hold the tray in place on top of the table 218 but aligned such that the openings in the tray would align with the openings in the table. For example, the receptacle may be a depression in the first surface 220-A of the table 218 or may include a latching mechanism that engages the tray structure to hold it in the correctly aligned position.

Opposite the first compartment 212 is a second compartment 224. In the second compartment 224 are one or more cases 226. In some embodiments, the cases 226 may be mounted to the housing 202 via brackets 244. In some other embodiments, the cases 226 may rest on the base of the housing 202. One or more test devices, such as test channels 402 (FIG. 9) and/or computers that run tests on the semiconductor devices, are held in the cases 226. The test devices or channels are circuit boards having a processor and memory and are configured to run tests on various types of semiconductor devices. The tests that are run may vary based on the type of semiconductor device to be evaluated or tested and based on the particular type of test to be conducted. In some embodiments, the test devices or channels may be further connected to a computer, such as a server (not shown). The computer may be configured to, among other things, control the testing process, collect data from the tests, and display the data from the tests. It should be appreciated that the test devices may alternatively reside outside of the housing 202, in which case, electrical connections from the test devices would be made via wires extending from the test devices into the housing at a suitable location for appropriate connection to the body 204 of the apparatus 200. Alternatively, if there are multiple test devices, some may reside within the housing 202 and some outside of the housing 202. Furthermore, the test devices and/or computers may be connected to a display device, such as a display monitor and input devices such as a keyboard and/or a mouse. Output from the test devices/computer may be displayed on the display monitor and the input devices may be used to input instructions to the test devices/computer.

The apparatus 200 also includes one or more interfaces 228 that electrically couple the one or more test devices (which may include the test channels and/or a computer) that reside within the housing 202 or external to the housing 202 and the semiconductor devices to be tested. In some embodiments, an interface resides under each opening 222. In some embodiments, the interface, or parts thereof, is removable. Further details regarding the interface 228 are described below.

Returning to the first compartment 212, above each of the openings 222 (i.e., the tray receptacles) is a movable surface or a movable first pressure surface 230. In some embodiments, the movable surface 230 may reside on a press plate 232. The movable surfaces 230 and the press plates 232 are mounted to a second movable pressure surface or movable mounting plate 234. In some embodiments, the movable surfaces 230 (or the press plates 232 on which the movable surfaces 230 reside) are mounted to the mounting plate 234 via brackets 236. In some other embodiments, the movable surfaces 230 (or the press plates 232 on which the movable surfaces 230 reside) may be mounted directly onto the mounting plate 234. The mounting plate 234 is mechanically coupled to a shaft assembly 238. The shaft assembly 238 controls the movement of the mounting plate 238 in a direction parallel to the length of the shaft assembly 238 and thus controls, in this orientation, the vertical movement of the movable surfaces 230 as well as the speed of movement. By moving the movable surfaces 230 vertically, the movable surfaces 230 may be moved toward to or away from the trays.

An opening 222, its corresponding tray receptacle, and its corresponding interface 228 define a station for testing semiconductor devices in the tray. The apparatus 200 may have a plurality of testing stations. The plurality of testing stations allows the testing process to be performed in an assembly line or pipeline manner. That is, each station performs particular tasks in the testing process simultaneously. For example, trays may be loaded onto the table at one station and then rotated to the other stations for subsequent testing. The tray would then be unloaded from the table at the last station. Alternatively, trays may be loaded and unloaded at one station for all test stations. The loading can be manual or automated, using tray sorters and feeders (not shown). It should be appreciated that the tests performed at each station can be varied and the manner or order in which the trays are loaded and unloaded and tested may be varied and performed in any sequence. For example, all of the trays for each station may be loaded and then similar testing performed at each station. Alternatively, all of the trays for each station may be loaded and then rotated to different stations where different or redundant testing is performed. Alternatively still, trays may be loaded and unloaded at a single station while previously loaded trays are being tested at the other stations. In this case, the tests performed at the other stations may be different or identical or redundant.

Figure 3:
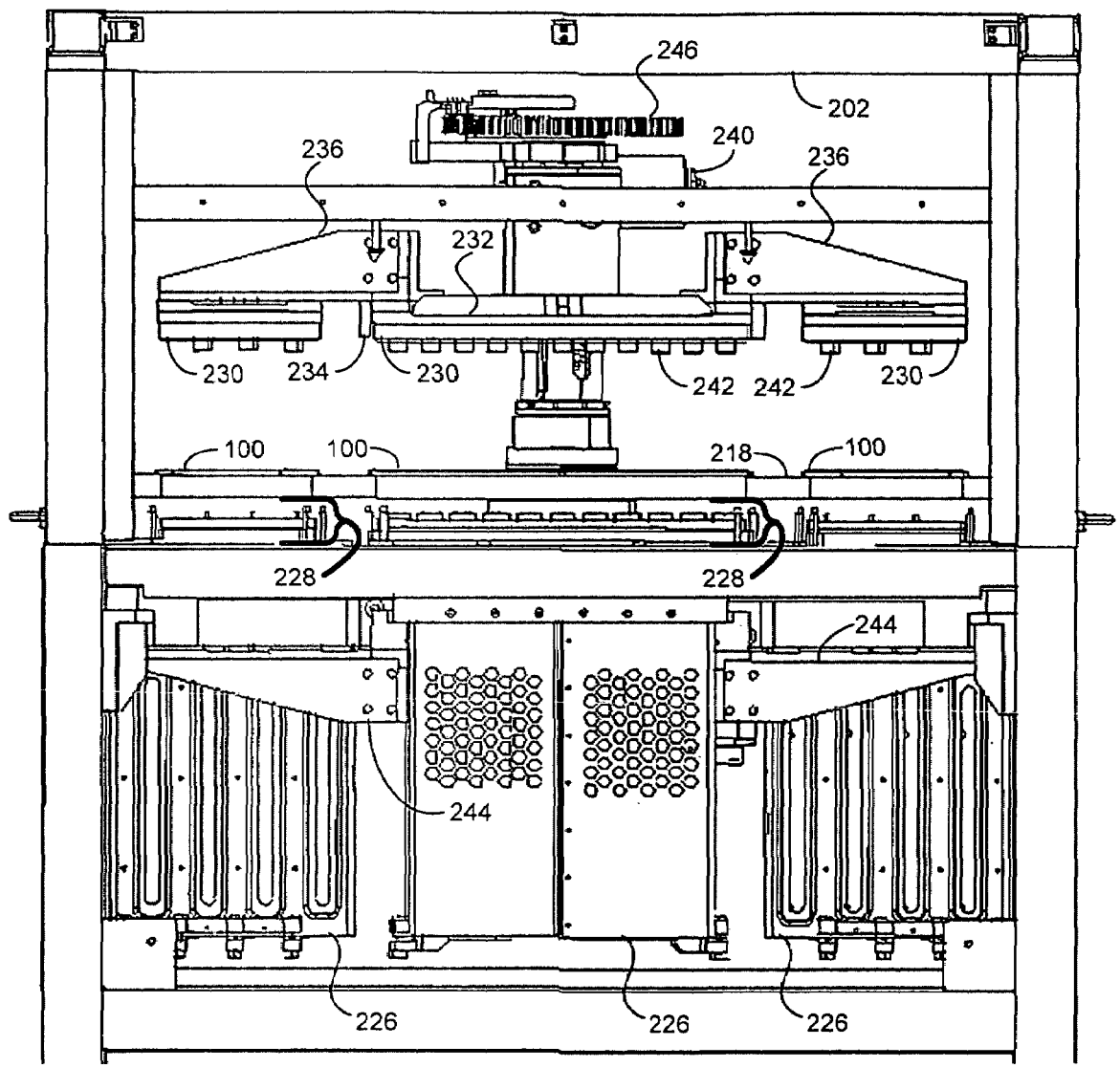
FIG. 3 illustrates a side view of the apparatus for testing semiconductor devices in accordance with some embodiments.

FIG. 3 illustrates a side view of the apparatus for testing semiconductor devices, in accordance with some embodiments. The table 218 and trays are located above the interfaces 228. The interfaces 228 are located above the cases 226, which are mounted to the housing 202 via brackets 244. Above the table 218 are the movable surfaces 230. The movable surfaces 230 are mounted to a mounting plate 234 via brackets 236. Running along the rotational axis of the mounting plate 234 and of the table 218 is a shaft assembly 238.

Extending from the movable surface 230 in a direction facing the table 218, are one or more extending members 242, such as pressure buffers. A buffer 242 is configured to engage an individual semiconductor device in a tray as the movable surface 230 approaches the table 218. In some embodiments, a buffer 242 may be manufactured from soft plastic and be spring-loaded such that upon contact with each semiconductor device the buffer may compress a short distance before force is exerted in the opposite direction by the spring. The buffers 242 are arranged on the movable surface 230 to match the arrangement of the cells on the tray such that a single buffer 242 corresponds to a single semiconductor device in the tray. When the movable surface 230 has moved toward the table 218 a sufficient distance, the buffers 242 apply force onto semiconductor devices in the trays to secure their position relative to the openings 222 in the table 218. In other words, the buffers 242 engage each semiconductor device while in the tray and hold it in place while electrical connection is made to the interface 228 and during testing.

In some embodiments, the buffers 242 are also configured or customized for particular semiconductor devices. For example, the buffers for use with SD cards may be different from the buffers for use with chips, and the arrangement of the buffers on the movable surface 230 may vary based on the type of semiconductor device and the orientation of the semiconductor devices in a particular type of tray. In some embodiments, instead of having a single buffer 242 per semiconductor device on the movable surface 230, a movable surface 230 may have a plurality of smaller buffers per semiconductor device, with the number of buffers in the plurality depending on the type of semiconductor device. Thus, the number of total buffers on the movable surface 230 may be a multiple of the number of semiconductor devices to be tested. In other words, the buffers may be configured for the particular type of tray and particular type of semiconductor device. Thus, to adapt to different trays with different cell arrangements that hold different types of semiconductor devices, in some embodiments, a movable surface 230 and buffers 242 may be removably attached to the press plate 232. The movable surface 230 and buffers 242 may be removed and replaced with a different movable surface 230 and buffers 242. In some other embodiments, the entire press plate 232 with the movable surface 230 and buffers 242 may be removable and replaced with one having a different configuration and type of buffers.

Figure 4:
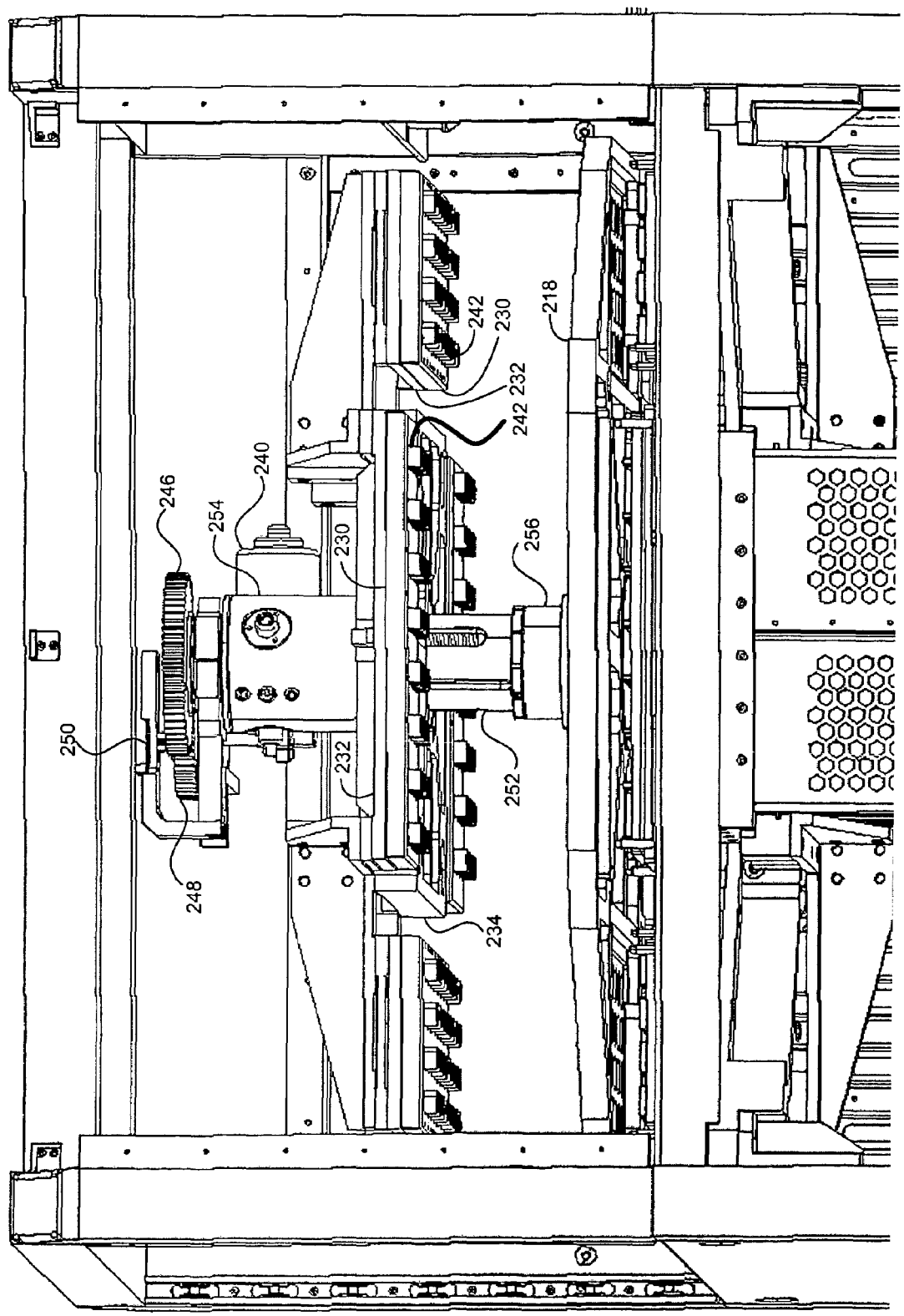
FIG. 4 illustrates a perspective view of a portion of the apparatus for testing semiconductor devices in accordance with some embodiments.
Figure 5:
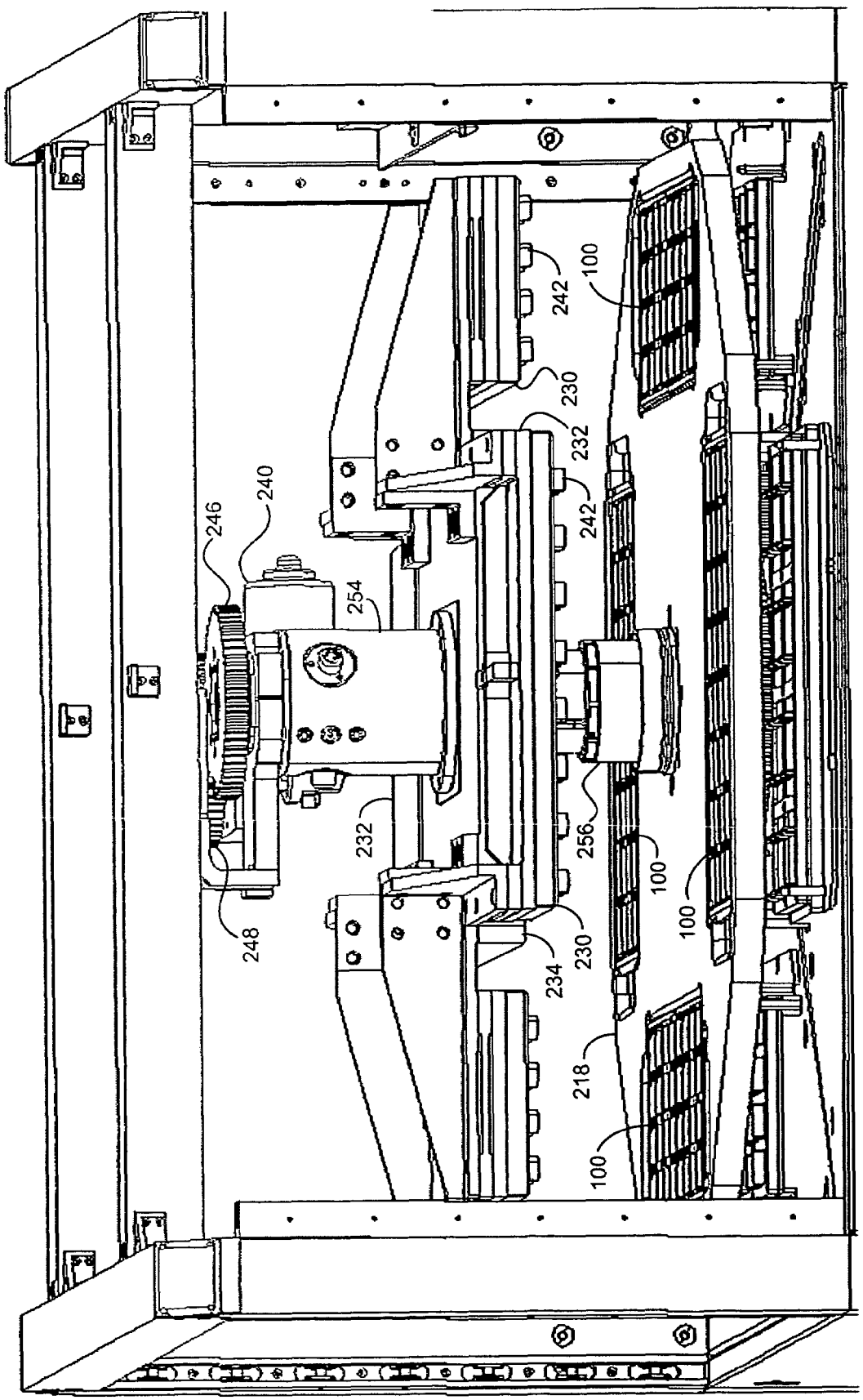
FIG. 5 illustrates a perspective view of a portion of the apparatus for testing semiconductor devices in accordance with some embodiments.
Figure 6:
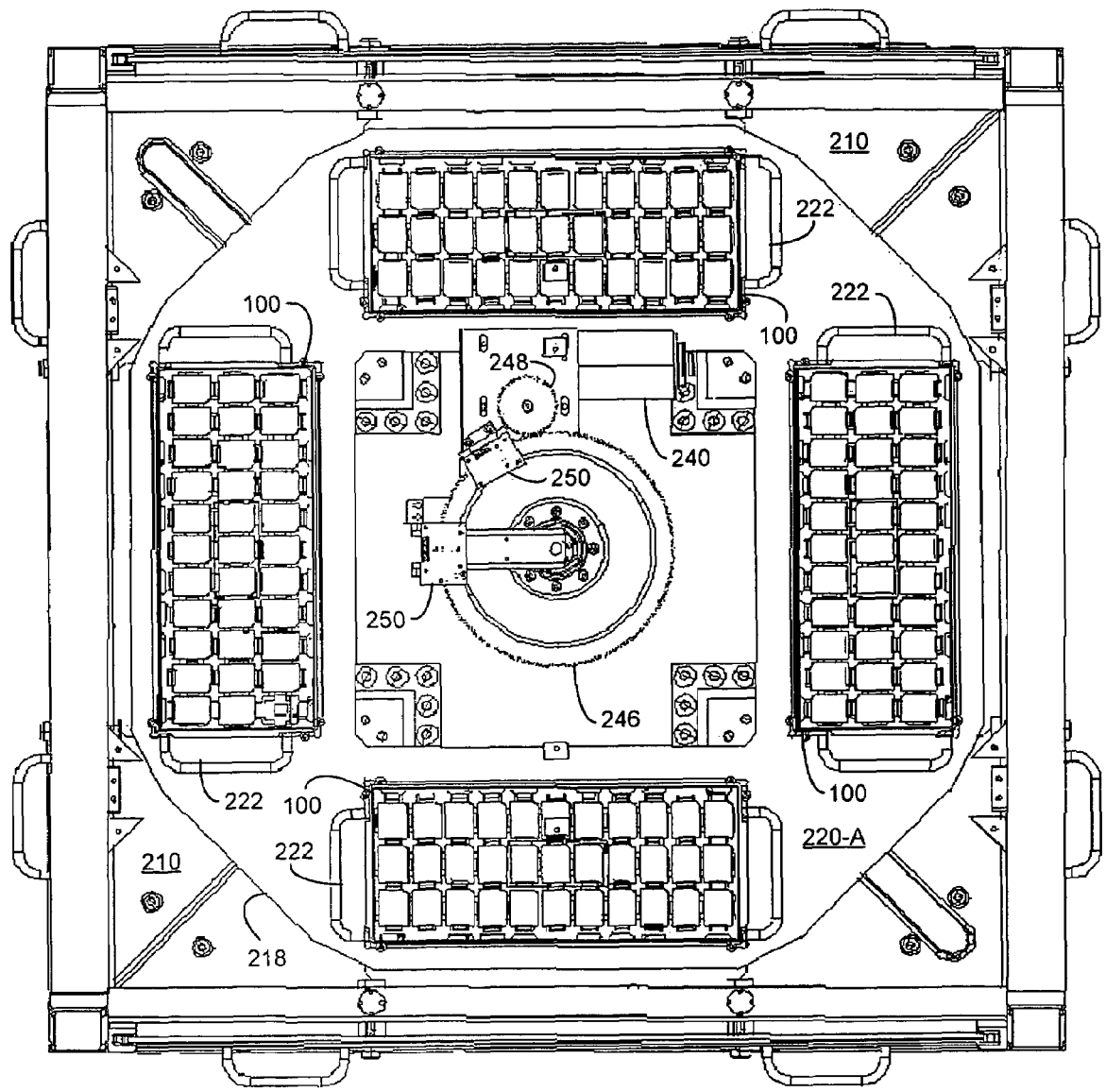
FIG. 6 illustrates a top view of a table and shaft assembly of the apparatus for testing semiconductor devices in accordance with some embodiments.

FIGS. 4-6 illustrate various views of the apparatus 200. Directing attention to these Figures the body 200 also includes a shaft assembly 238 that includes, among other things, a motor 240, an output gear 246, a mounting cylinder 254, a guiding cylinder 252 (FIGS. 7A-7F), and a bushing 256. Coupled to the bushing 256 is a flange 276 onto which the table 218 is mounted. The mounting plate 234 is mounted onto a flange 258 on the mounting cylinder 254. Thread pegs 264 penetrate the mounting cylinder 254 from without and extend into the interior of the shaft assembly 238.

The motor 240 drives a reduction gear 248 that is coupled to, and whose rotation moves, the output gear 246. One or more encoders 250 monitor the rotations of the reduction gear and the output gear and generate a signal to a controller (not shown) of the motor 240. The signal may be used to control the speed of the motor. A motor controller may be programmed to control the speed and rotation of the motor during use or operation of the shaft assembly 238 and allows the motor to be operated such as to follow any preprogrammed speed profile.

FIGS. 7A-7F illustrate parts of a shaft assembly 238 of the apparatus, in accordance with some embodiments. The shaft assembly 238 includes the motor 240, reduction gear 248, output gear 246, and one or more encoders 250. The shaft assembly 238 also includes a guiding cylinder 252, a mounting cylinder 254, and a bushing 256.

Figure 7A:
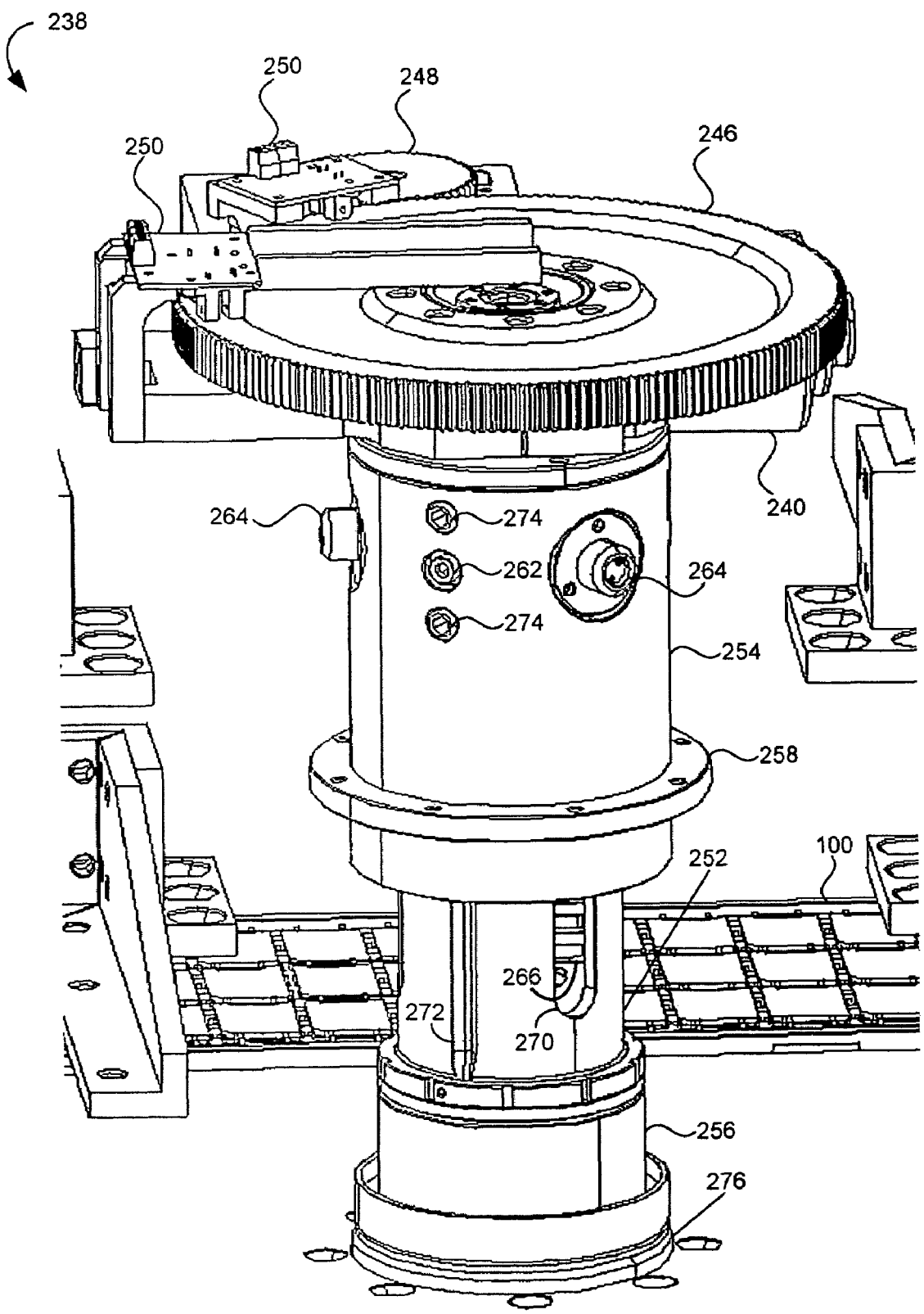
FIGS. 7A-7F illustrate parts of a shaft assembly of the apparatus in accordance with some embodiments.
Figure 7B:
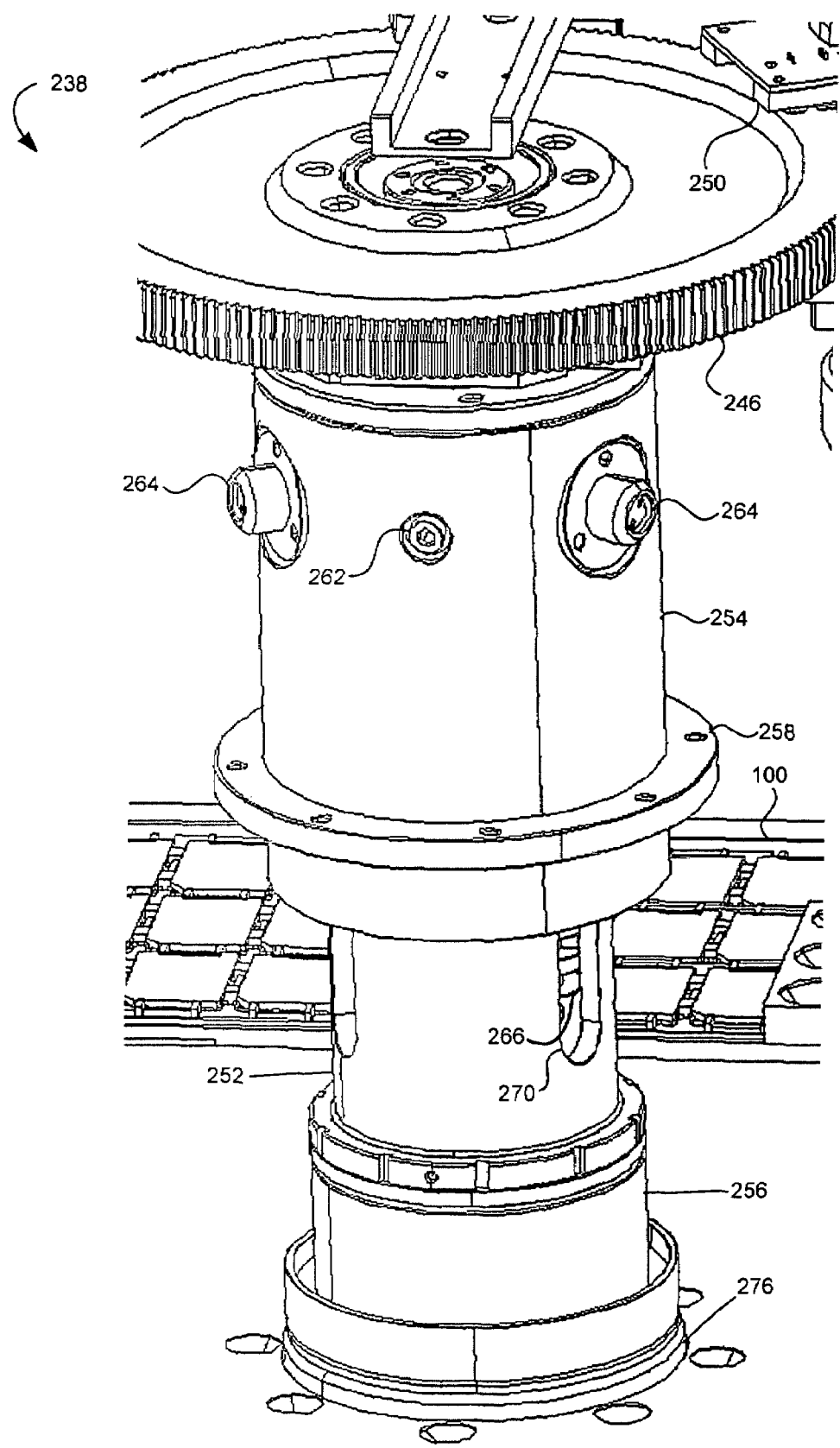
Figure 7C:
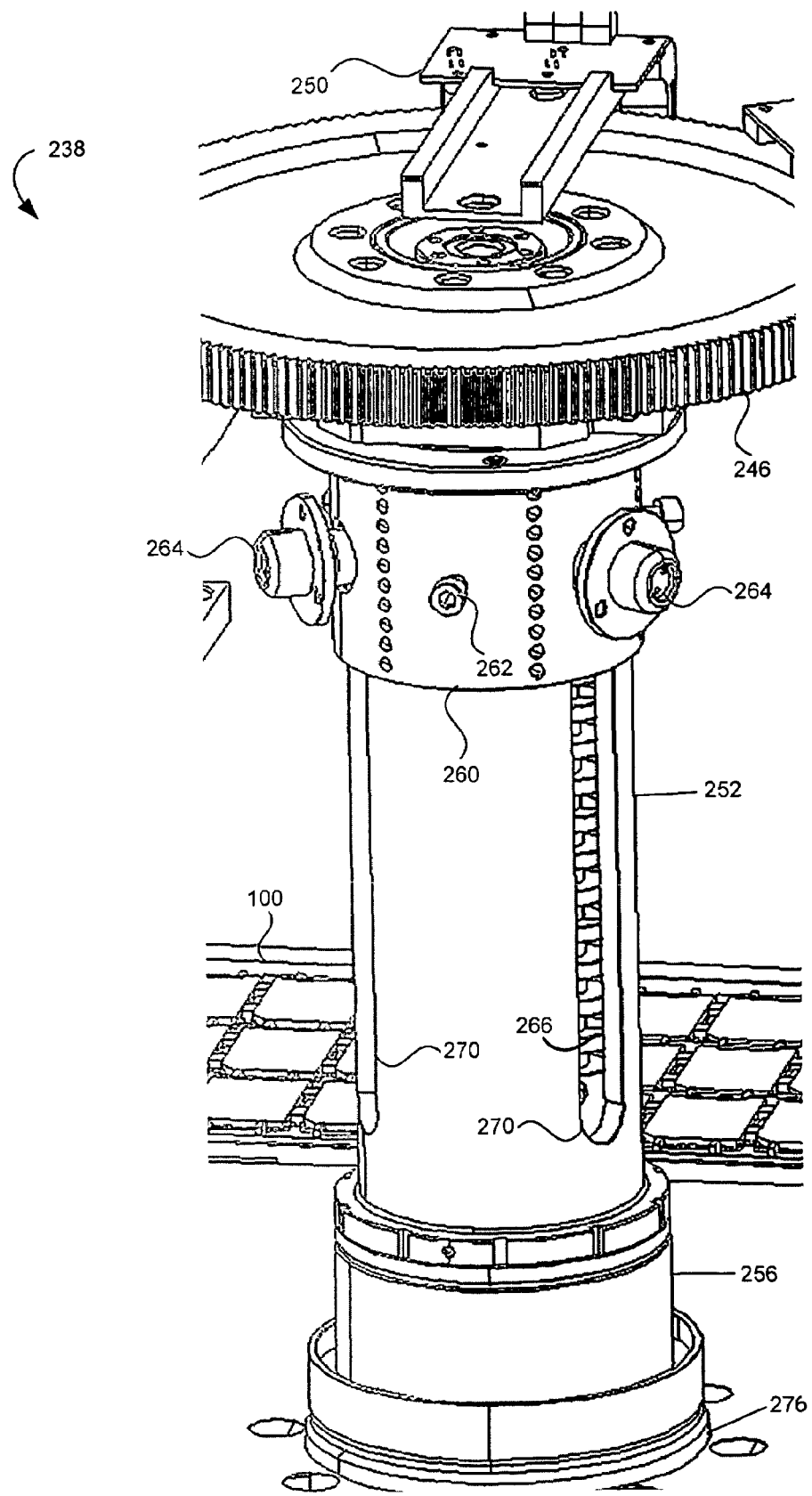
Figure 7D:
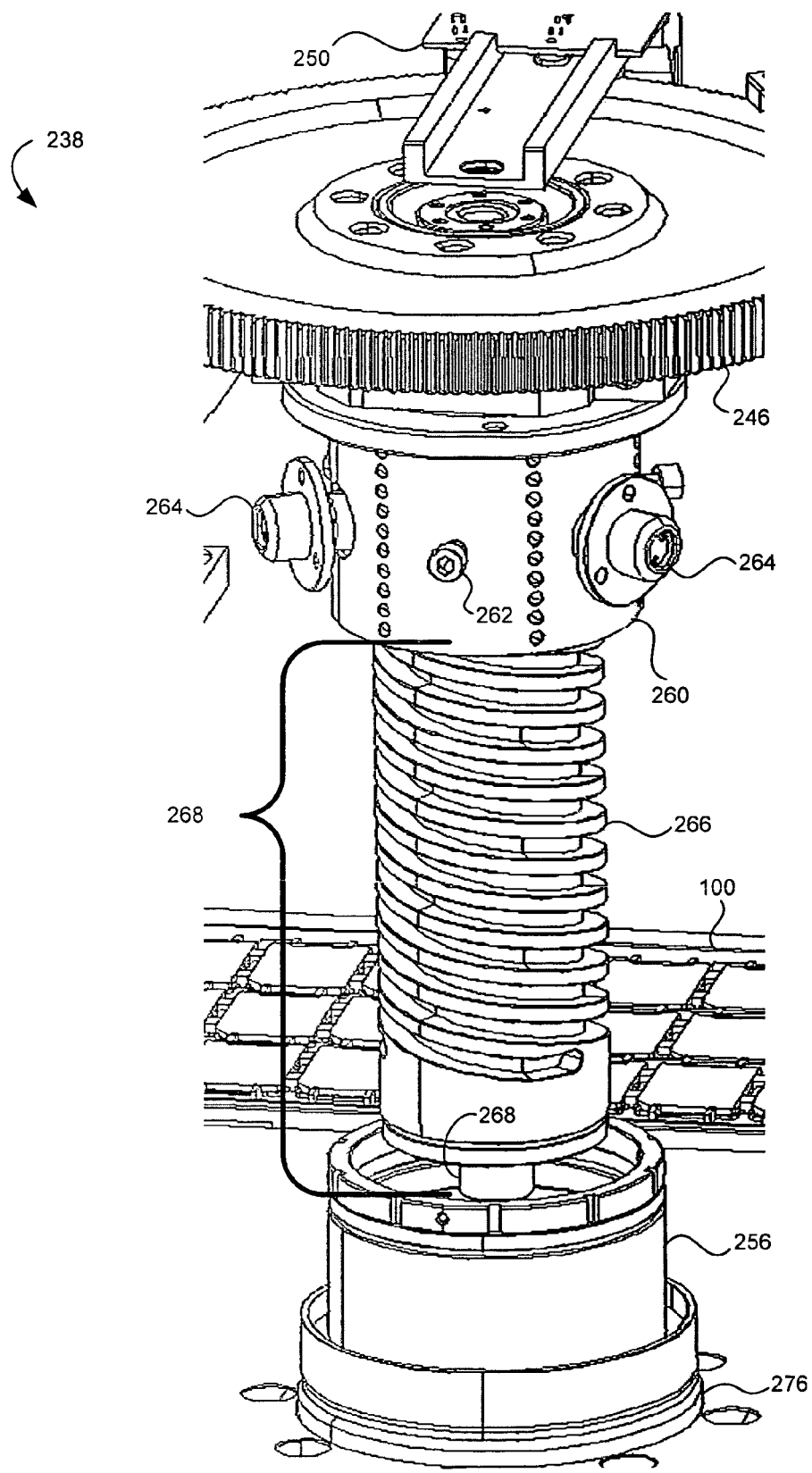
Figure 7E:
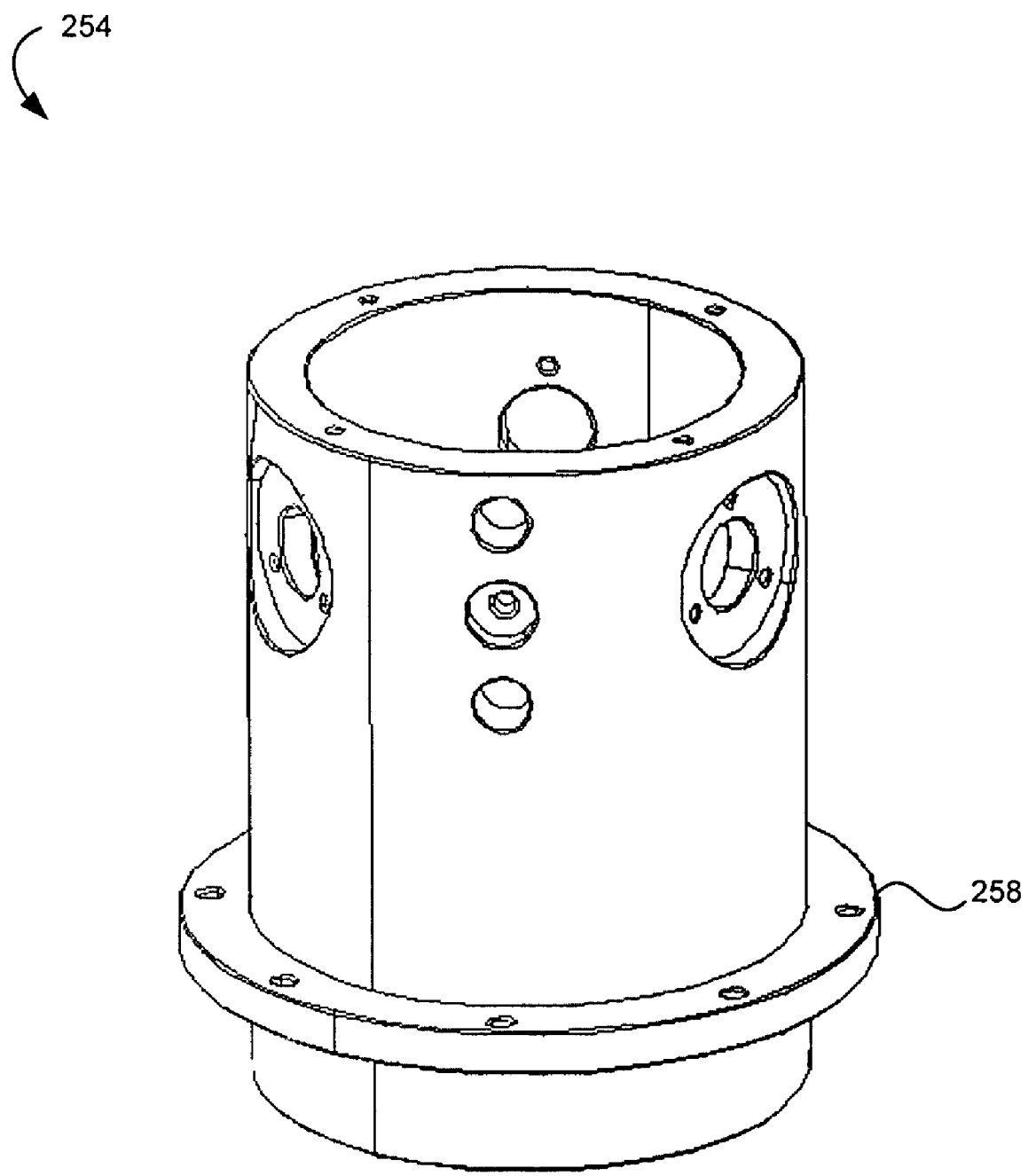

The mounting cylinder 254, also shown in FIG. 7E by itself, includes a flange 258 to which the mounting plate 234 is mounted. The mounting cylinder 254 is coupled to a collar 260 by bolts, screws, or the like 262, placed at regular intervals about the circumference, and consequently the mounting cylinder 254 and the collar 260 moves in tandem. A plurality of thread pegs 264 is also mounted to the mounting cylinder

254. In some embodiments, there are three thread pegs, evenly spaced apart (i.e., 120 degrees apart) about the circumference of the mounting cylinder 254. The thread pegs 264 protrude through the mounting cylinder 254 and through the collar 260 to engage threads 266 on a threaded shaft 268, further details of which are described below.

Figure 7F:
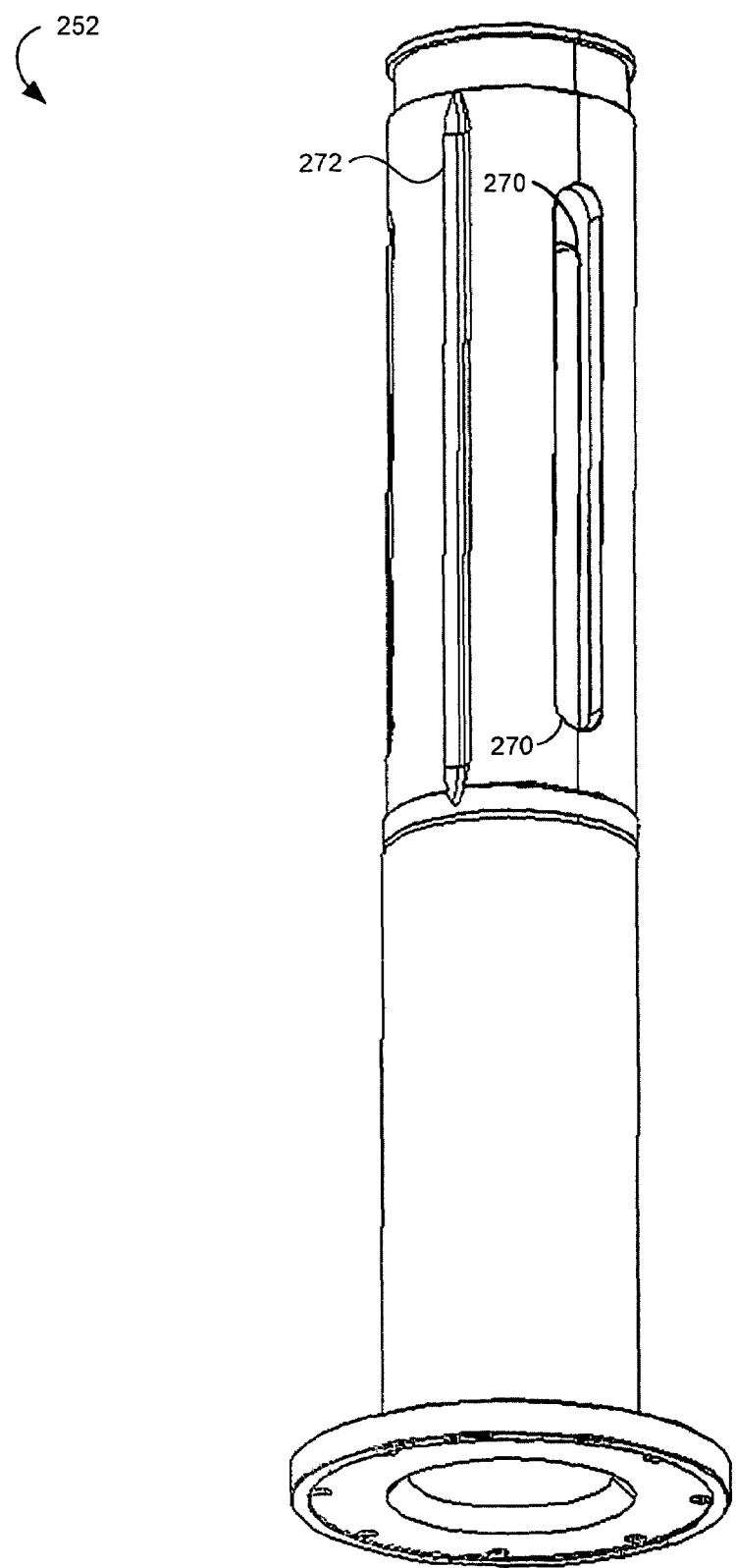

The guiding cylinder 252, also shown in FIG. 7F by itself, is a cylinder where at least a portion of its length is hollow. The guiding cylinder 252 includes one or more slots 270 and a groove 272. In some embodiments, the slots are spaced evenly apart (i.e., 120 degrees) about the circumference of the guiding cylinder 252. The thread pegs 264 protrude through the slots 270 and engage the threads 266 on the threaded shaft 268, which resides in the hollow part of the guiding cylinder 252. One or more guiding pegs 274 are coupled to the mounting cylinder 254 and penetrate through the mounting cylinder 254 and collar 260, engaging the groove 272. In some embodiments, the tips of the guiding pegs 274 that engage the groove 272 are machined to match the contour of the groove 272. The guiding peg 274 and groove 272 help restrict the rotation of the mounting cylinder 254, thus restricting rotation of the movable surfaces 230, which are indirectly coupled to the mounting cylinder 254. The end of the guiding cylinder 252 opposite the end near the motor and gears passes through a bushing 256. The bushing is coupled to a flange 276 to which the table 218 is mounted. In some embodiments, the flange 276 is integrated with the bushing 256.

Within the guiding cylinder 252 is a threaded shaft 268, such as a leadscrew, with one or more threads 266. The threaded shaft 268 is mechanically coupled to the output gear 246, whose rotation rotates the threaded shaft 268. The output gear 246 may drive the threaded shaft 268 via one or more cams. In some embodiments, the output gear 246 and threaded shaft 268 form a camshaft. The thread pegs 264 engage the threads 266; the threads 266 exert force on the thread pegs 264. In some embodiments, the threads 266 on the threaded shaft 268 have a uniform pitch. In some other embodiments, the threads 266 on the threaded shaft 266 have variable pitch. More particularly, the pitch of the threads 266 decreases as the threads travel along the shaft 268 toward the table 218. It should be appreciated that the guiding cylinder 252 remains stationary throughout operation of the shaft assembly 238, preferably neither rotating nor moving.

The threads 266 rotate as the threaded shaft 268 rotates. The rotating threads 266 exert force on the thread pegs 264, converting the rotation of the shaft 268 and threads 266 into linear motion of the mounting cylinder 254, which as described above is coupled to the thread pegs 264. This causes the movable surfaces 230, which are indirectly mounted to the mounting cylinder 254, to move as well. The guiding pegs 274 and the groove 274 prevent the mounting cylinder 254 from rotating around the shaft 268. This also helps prevent the movable surfaces 230 from revolving around the shaft 268. As a result, the movable surfaces 230 may be moved in a direction parallel to the rotational axis of the shaft 268.

When the mounting cylinder 254 moves down a predetermined distance, the lower rim of the mounting cylinder 254 engages and exerts force upon (pushes down on) the bushing 256. Because the table 218 is coupled to the bushing 256 via the flange 276, exertion of force on the bushing 256 causes the table 218 to move down along with the mounting cylinder 254. Further details regarding movement of the table are described below.

FIGS. 8A-8F illustrate parts of an interface to one or more test devices, in accordance with some embodiments. The interface 228 electrically couples the semiconductor devices to be tested to the test devices; the test device(s) sends data to and receives data from the semiconductor devices via the interface. In some embodiments, each opening 222 for a semiconductor tray on the table has a corresponding interface 228. In some embodiments, the interface 228 is modular and may be removable from the body of the apparatus, which allows customized interfaces to be constructed and used. Generally, the interface includes a first electrical interface, a second electrical interface, and an interface module. The first electrical interface provides a physical and electrical connection between the electrical contacts of the semiconductor devices being tested to the interface module. The second electrical interface provides a physical and electrical connection between the interface module to the test devices themselves. In some embodiments, the first electrical interface is removable from the interface 228, allowing for first electrical interfaces that are customized.

Figure 8A:
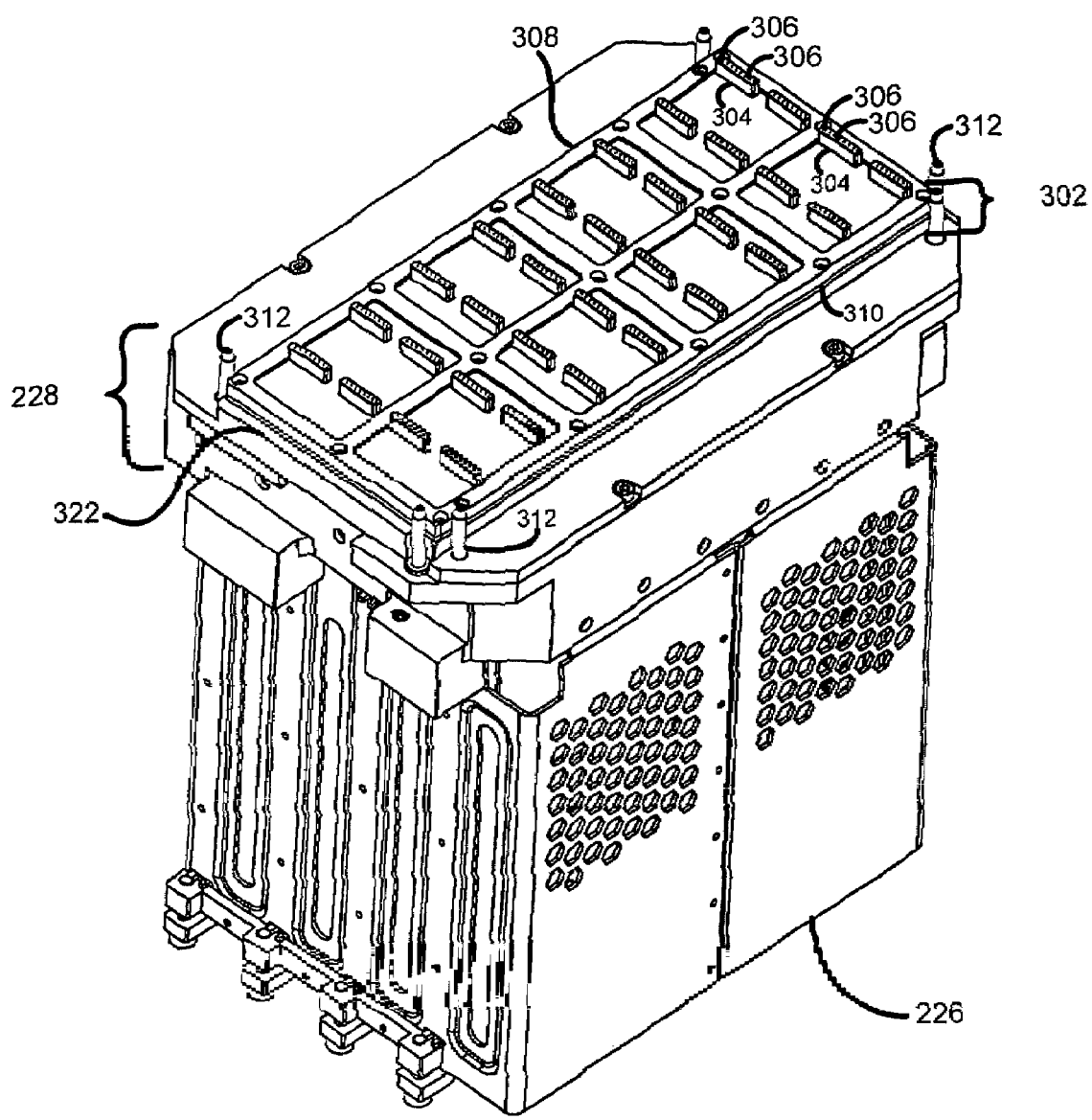
FIGS. 8A-8F illustrate parts of an interface between a tray and one or more test devices in accordance with some embodiments.
Figure 8B:
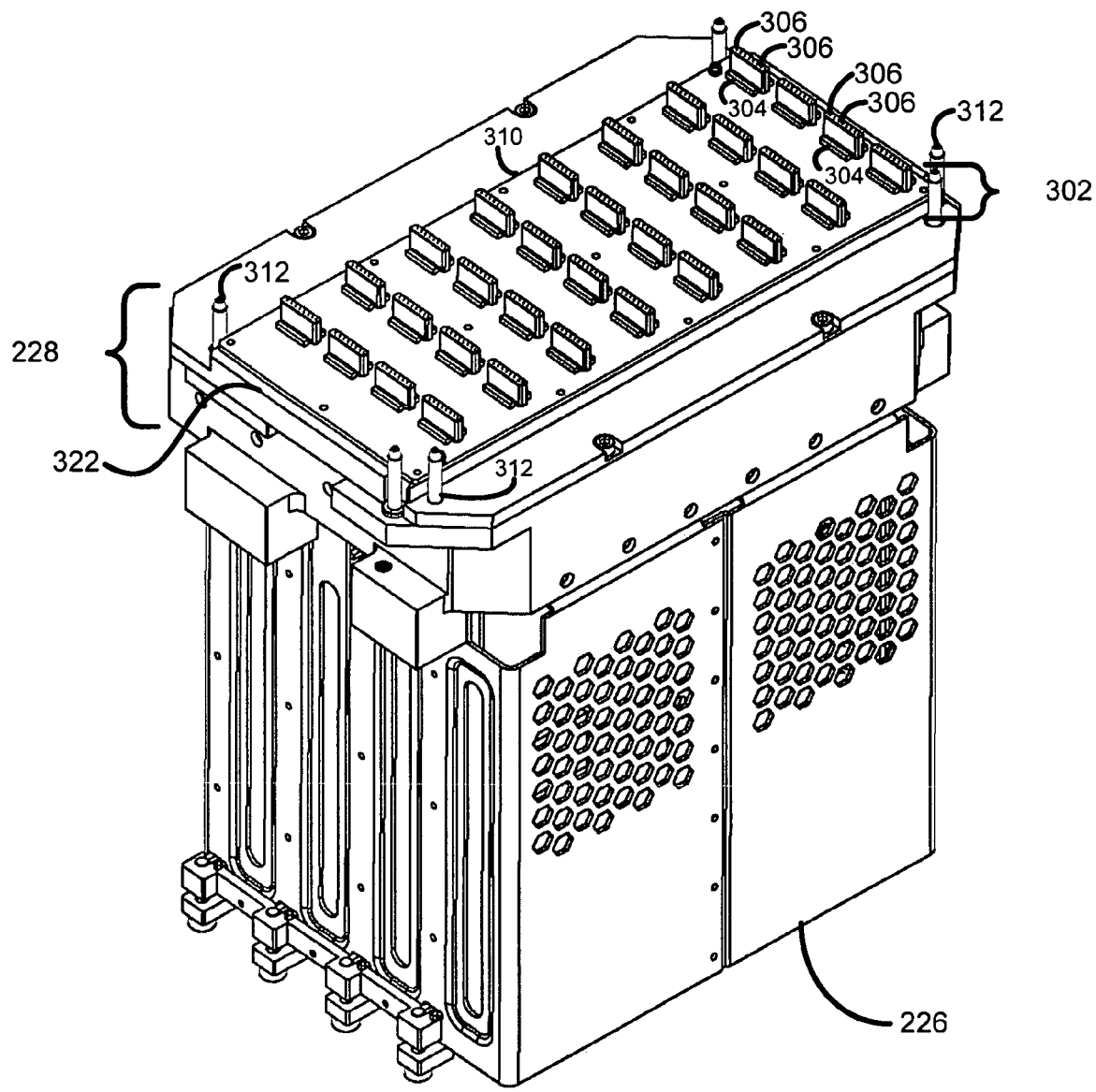
Figure 8C:
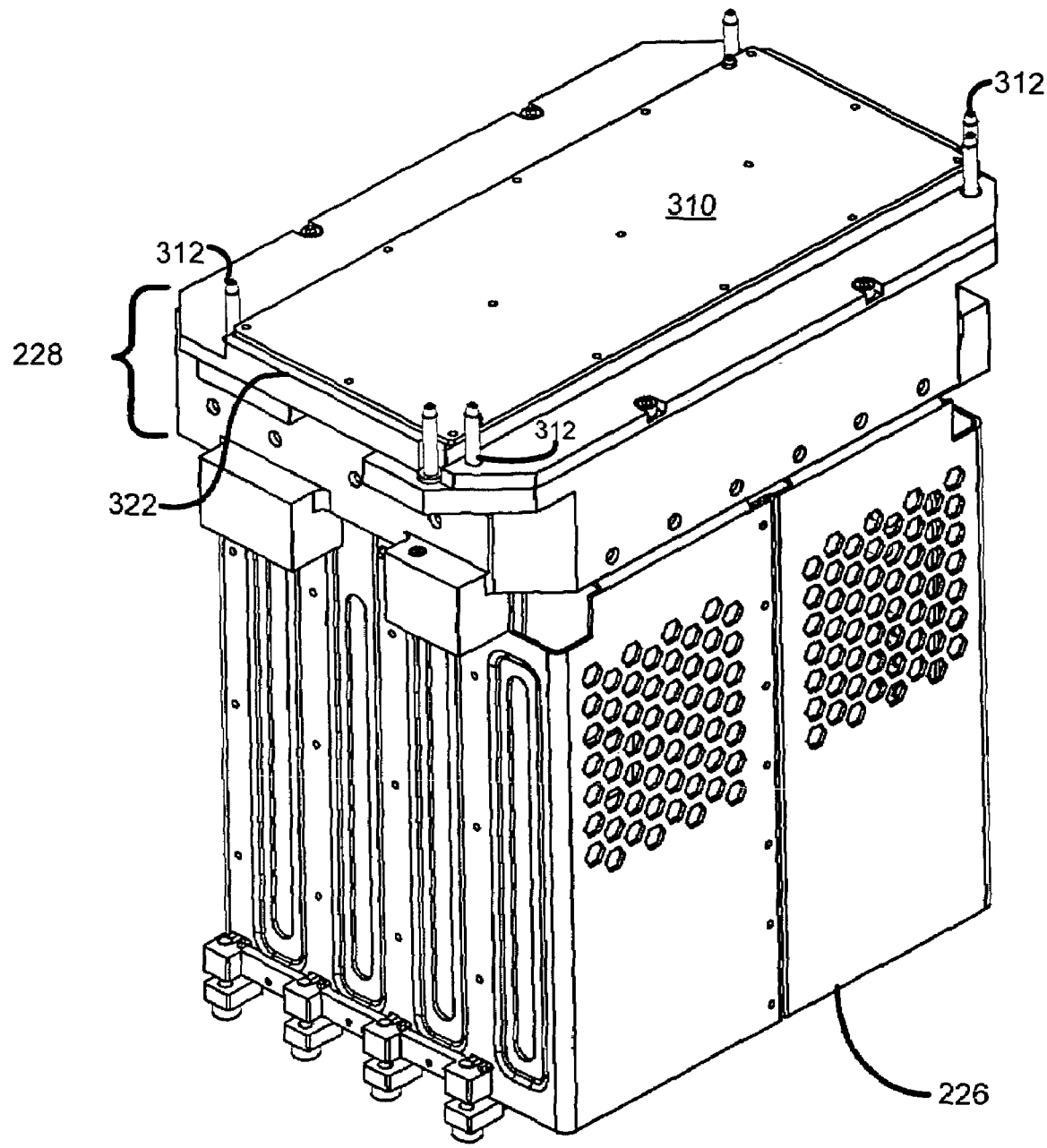

The first electrical interface 302 faces the table 218 and includes a plurality of cartridges 304. Each cartridge 304 holds a bank of pogo pins (or another suitable type of electrical contact) 306 extending from the bottom surface of the cartridge 304 and protruding to the top surface of the cartridge 304. A pogo pin 306 is a conductive element or electrical contact that electrically couples an electrical contact on a semiconductor device to a printed circuit board (PCB) 310 (FIG. 8A-8B).

The cartridges 304 rest on the PCB 310 and are arranged into positions corresponding to the apertures for the cells of the tray by an alignment plate 308. The cartridges are arranged such that each cartridge corresponds and aligns with the opening of a single cell. In some embodiments, alignment pillars 312 may be included in order to align the alignment plate 308, PCB 310, and a tray.

In some embodiments, the number of cartridges 304 on the first electrical interface 302, the number of pogo pins 306 per cartridge, and the shape of the cartridge 304 is customized to the semiconductor device to be tested and the tray used, in particular, the arrangement and position of the openings in the tray. In FIG. 8A-8B, the cartridges 304 and the pogo pins 306, as shown, are customized for SD cards held in a particular type of tray; the number of pogo pins per cartridge matches the number of electrical contacts on a SD card and a cartridge aligns its respective pogo pins in accordance with the arrangement of the electrical contacts on a SD card.

The PCB 310 (FIG. 8C) includes a first surface 314 and a second surface 316 opposite to the first surface 314. The arrangement of the electrical contacts (e.g., a printed circuit) on the first surface 314 physically contact the pogo pins 306 and is customized to the arrangement of the pogo pins. In other words, the arrangement of the electrical contacts on the first surface 314 is customized, at least indirectly, to the type of semiconductor device to be tested and to the tray being used to hold the semiconductor devices. Such a customized arrangement may be required to allow the pogo pins to be properly spaced and oriented based upon the orientation of the respective electrical contacts of the semiconductor device and to provide proper physical contact between the pogo pins respective electrical contacts of the semiconductor device.

Opposite to the first surface 314 on the PCB 310 is the second surface 316. The second surface 316 also includes electrical contacts (e.g., a printed circuit); these electrical contacts are electrically coupled to the electrical contacts on the first surface 314. The electrical contacts on the second surface 316 follow a standard or common arrangement. That is, the arrangement of the electrical contacts on the second surface 316 is the same regardless of the type of semiconductor devices or trays in use, and is in accordance with the arrangement of electrical contacts on the interface module, further details of which are described below.

Figure 8D:
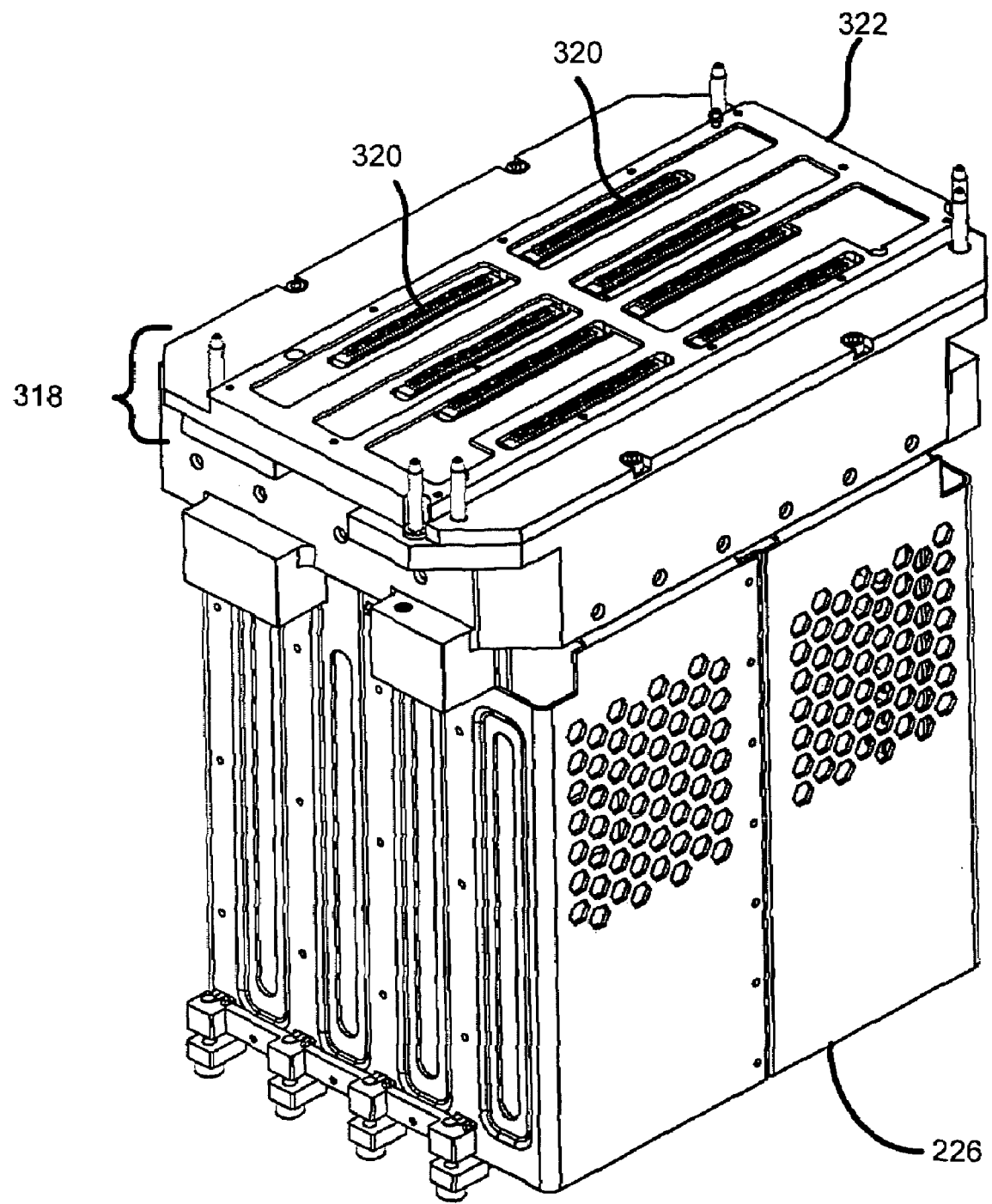
Figure 8E:
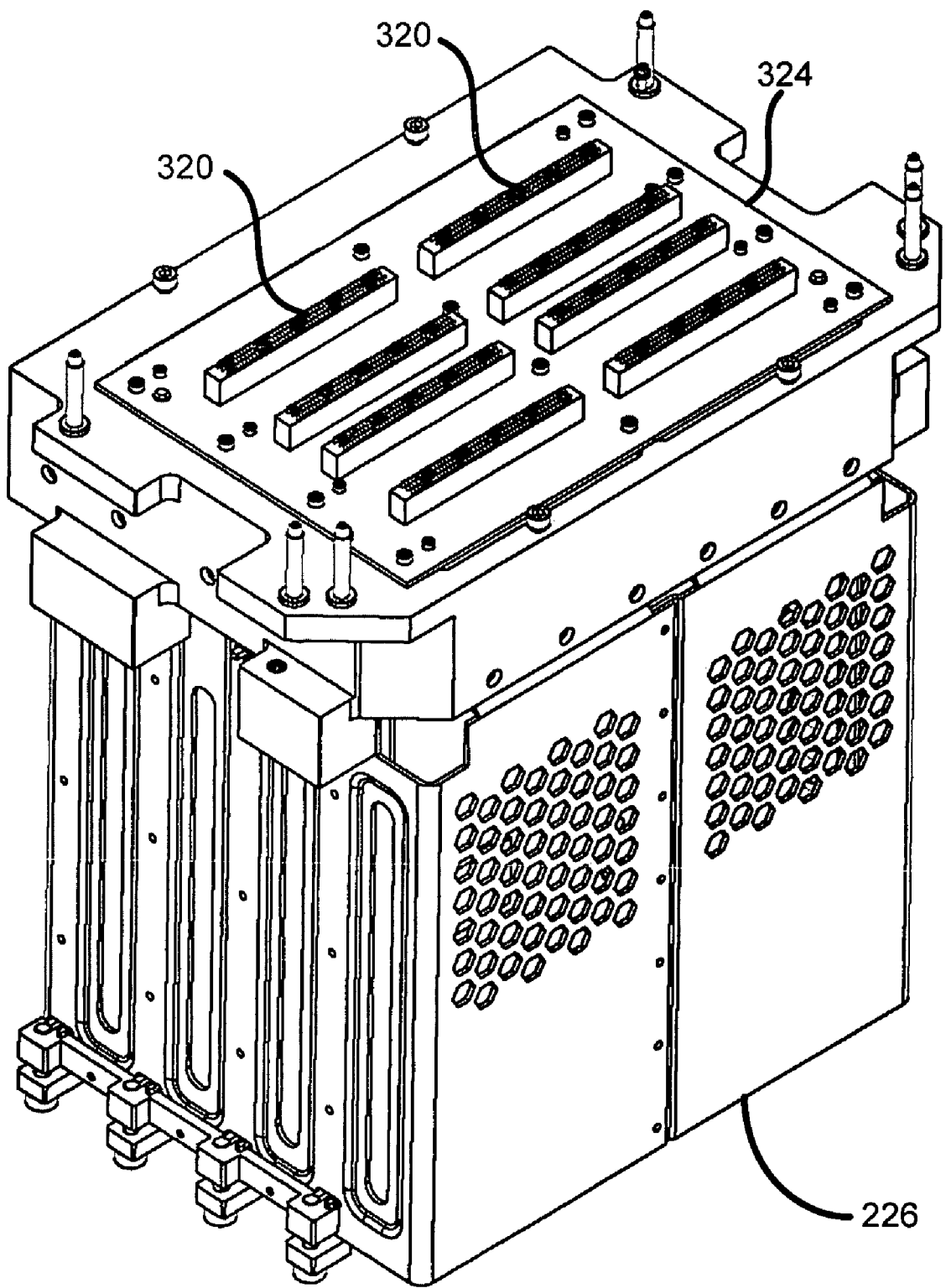
Figure 8F:
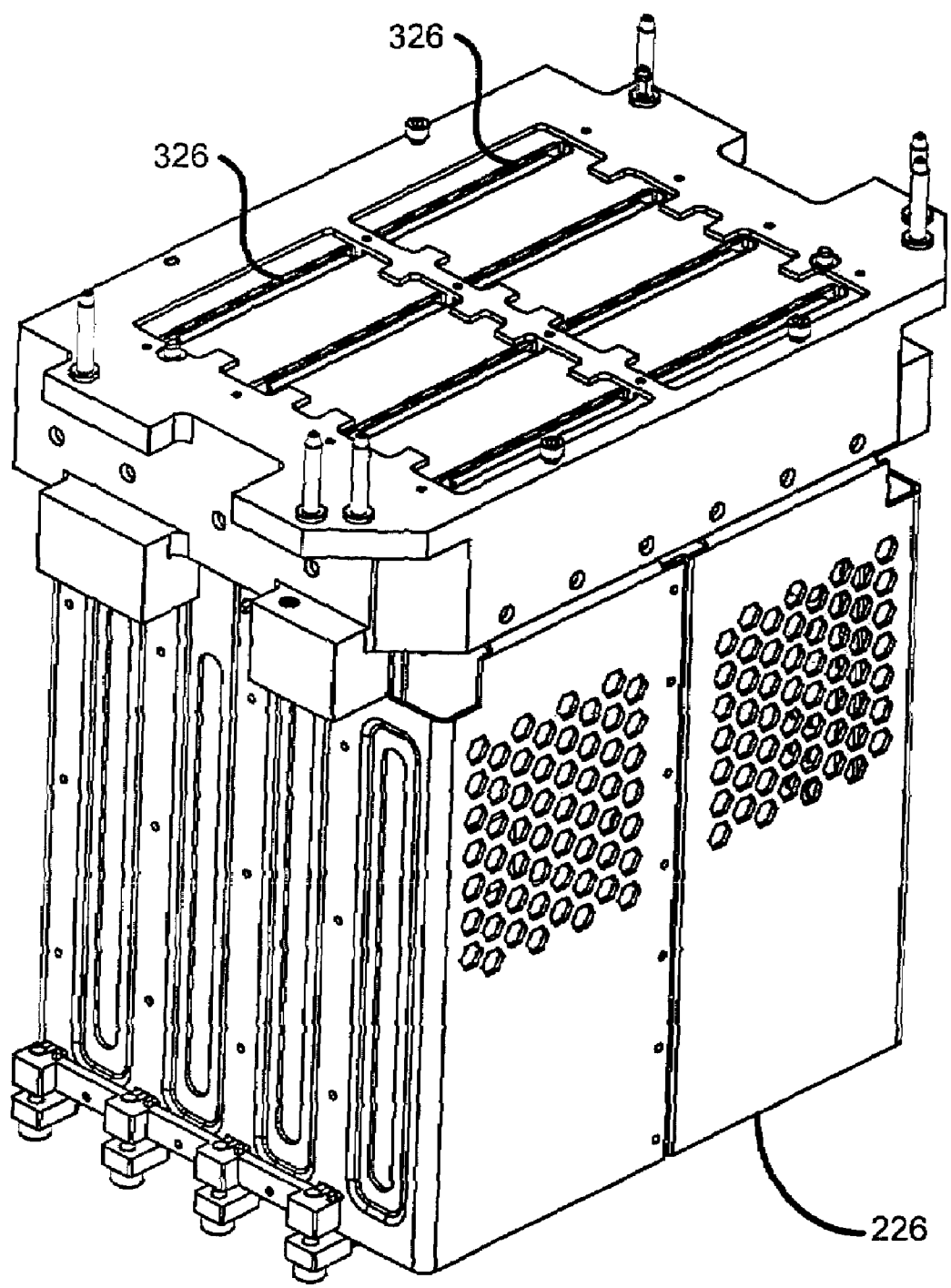

The interface module 318 includes banks of pogo pins or other types of electrical contacts 320, which may be held in cartridges. The banks of pogo pins 320 are aligned into position by an interposer alignment plate 322 and in use provide a physical and electrical connection to the respective contacts on the second surface 316 of the PCB 310 in the first electrical interface 302. These banks of pogo pins 320 rest on, and are electrically coupled to, an interposer PCB 324 (FIG. 8E) that resides under the interposer alignment plate 322 (FIG. 8D). The interposer PCB 324 also includes two surfaces. One surface, the surface facing the first electrical interface 302, includes electrical contacts (e.g., a printed circuit) electrically coupled to the pogo pins 320 held by the cartridges. The other opposite surface includes electrical contacts (e.g., a printed circuit) that are electrically coupled to the second electrical interface 326 (FIG. 8F). In some embodiments, the second electrical interface 326 includes interfaces that conform to the Universal Serial Bus (USB) standard.

The first electrical interface 302 may vary based on the type of semiconductor device to be tested and/or the type of tray used, while the interface module may be common across different types of semiconductor devices and trays. The first electrical interface 302 is removably connected to, and thus removable from, the apparatus body 204, and allows the apparatus 200 to adapt to, and thus test, a wide variety of semiconductor devices. For example, if the apparatus 200 is to be used to test SD cards, the first electrical interface that is customized for SD cards is used. If the apparatus 200 is then to be used to test another type of semiconductor device, then the first electrical interface for SD cards is removed and the first electrical interface for the particular semiconductor device type is installed.

Figure 9:
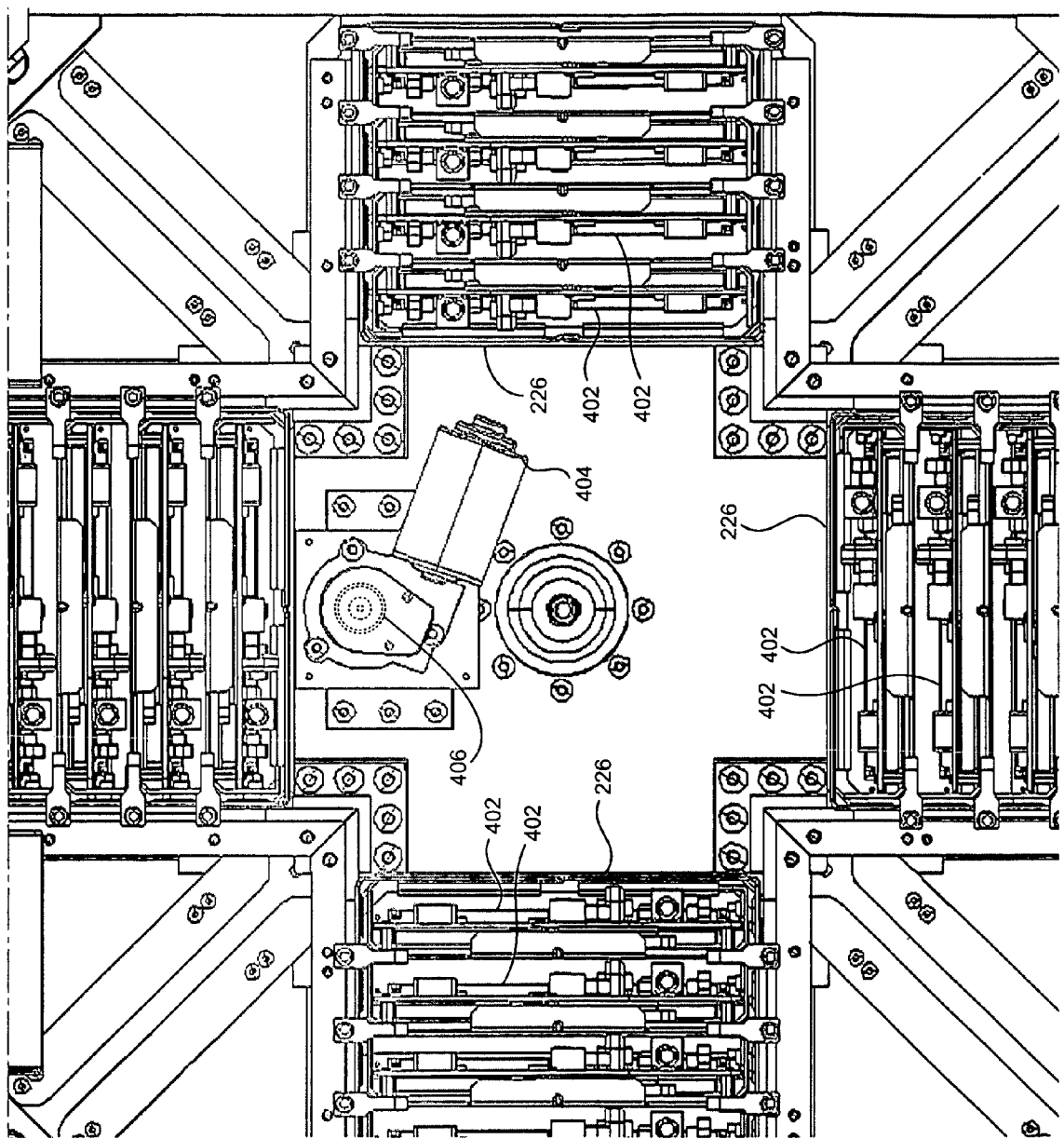
FIG. 9 illustrates a bottom view of the interior of the apparatus for testing semiconductor devices in accordance with some embodiments.

FIG. 9 illustrates a bottom view of the interior of the apparatus for testing semiconductor devices in accordance with some embodiments. A case 226 may hold a plurality of test channels 402. A table motor 404 resides under the table 218. The table motor 404 rotates (e.g., via one or more cams) a table reduction gear 406. The table reduction gear 406 drives a table output gear 408, which also drives rotation of the table 218, further details of which are described below.

Figure 10A:
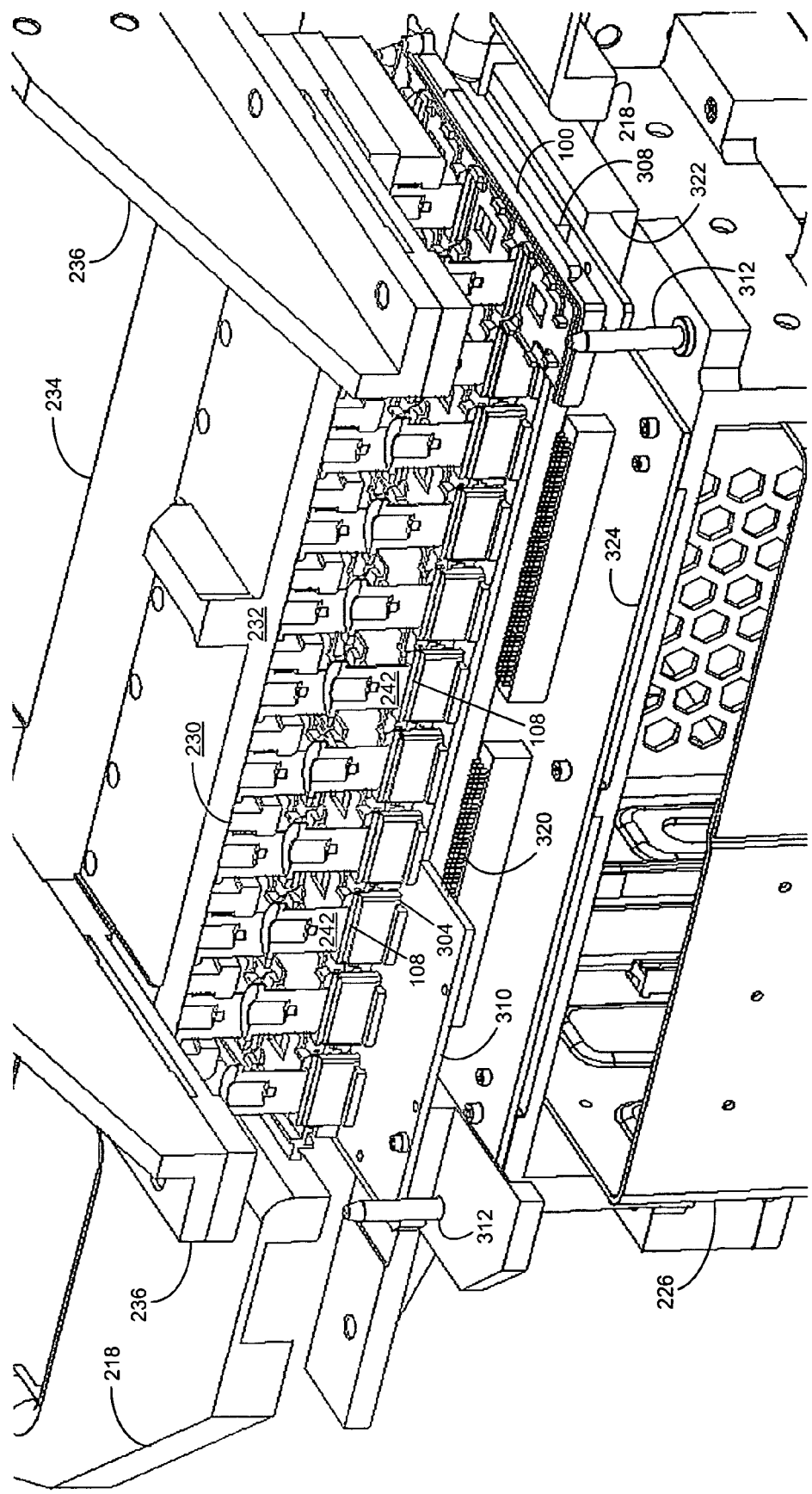
FIGS. 10A-10B illustrate views of semiconductor devices in trays secured in place for testing within the apparatus for testing semiconductor devices in accordance with some embodiments.
Figure 10B:
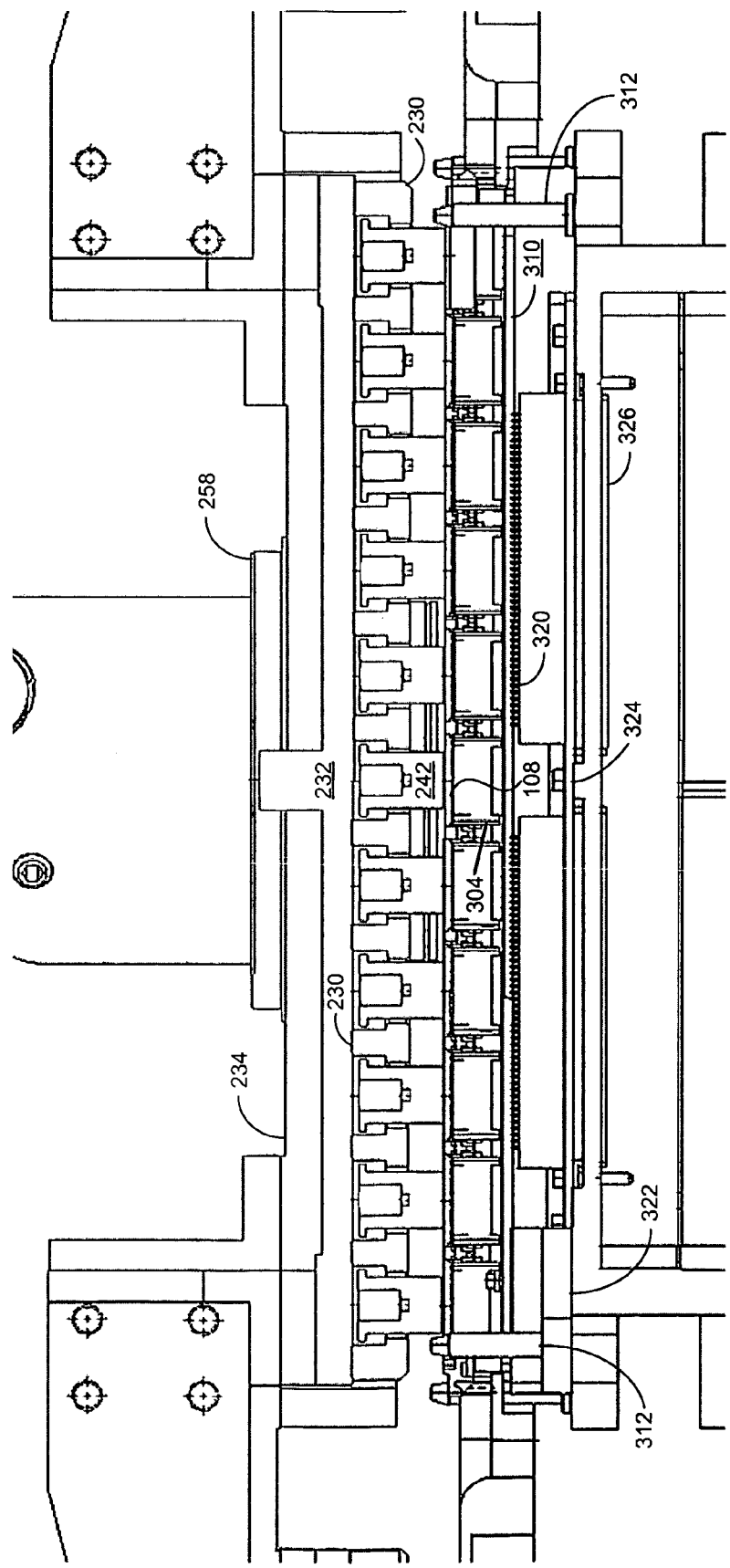
Figure 11:
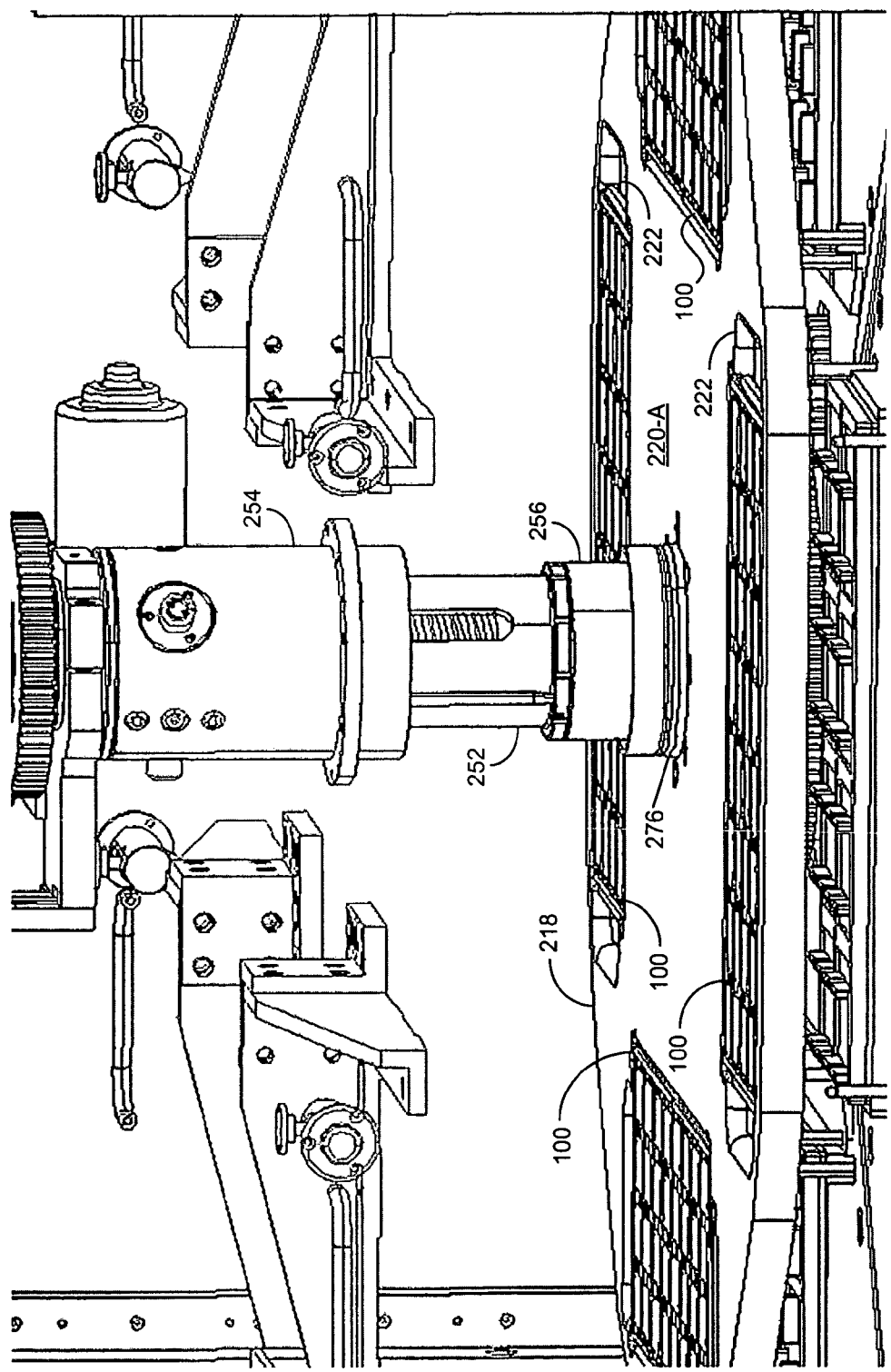
FIG. 11 illustrates a view of the table and the shaft assembly of the apparatus in accordance with some embodiments.

FIGS. 10A-10B illustrate views of semiconductor devices in trays secured in place for testing within the apparatus for testing semiconductor devices, in accordance with some embodiments. FIG. 11 illustrates a view of the table and the shaft assembly of the apparatus in accordance with some embodiments. As described above, the movable surfaces 230 and the buffers 242 move toward the trays. The details of this movement, as well as the movement of the table 218, all leading to the securing in place of the semiconductor devices for testing, are described below.

When the threaded shaft 268 and the threads 266 rotate in a particular direction, the mounting cylinder 254 and the movable surfaces 230 moves toward the trays. Initially, the table 218 does not move. When the mounting cylinder 254 moves a predetermined distance toward the table 218, the lower rim of the mounting cylinder 254 engages and exerts force upon (pushes down on) the bushing 256. Because the table 218 is coupled to the bushing 256 via the flange 276, exertion of force on the bushing 256 by the mounting cylinder 254 causes the table 218 to move down along with, and in the same direction as, the mounting cylinder 254. In some embodiments, the relevant components are calibrated and manufactured such that the mounting cylinder 254 engages the bushing and thus begins pushing down the table 218 when the buffers are just hovering over the semiconductor devices, almost touching, or barely touching the semiconductor devices.

As the trays move toward the interface 228, the trays are guided into alignment with the first electrical interface(s) 302 by the alignment pillars 312. The cartridges 304 on the first electrical interface 302 rest on PCB 310, which is electrically coupled to the pogo pins 320 resting on the interposer PCB 324. At some point in the motion toward the first electrical interface 302, the semiconductor devices engage the cartridges 304 and the pogo pins 306 in the first electrical interface 302 of the interface 222. The cartridges 304 exert force on the semiconductor devices, which may cause the semiconductor devices to lift from the tray at a distance that may be only a few millimeters, while the buffers 242 and the table 218 continue to move toward the trays. The buffers 242 then engage and exert force on the semiconductor devices. The semiconductor devices are thus held in place in the tray between the buffers 242 and the cartridges 304. In some embodiments, the threaded shaft 268 and the threads 266 (as controlled by the motor 240) cease rotating at a given point such that the table stops moving just as the semiconductor devices engage the cartridges 304 causing them to lift slightly over their respective cells from the force exerted by the cartridges 304, and engage the buffers 242 thereby securing the semiconductor devices in place, as shown in FIGS. 10A-10B.

It should be appreciated that the threads 266 on the threaded shaft 268 may be designed such that the speed at which the movable surfaces 230 move toward the trays varies. For example, the pitch of the threads 266 may be decreased closer to the end of the threaded shaft 268 nearest to the table 218. Accordingly, as the thread pegs 264 travel along the slots 270 of the guiding cylinder 252, the speed at which the movable surfaces 230 approach the table 218 or the trays is reduced. Alternatively, a variable speed motor may be used with a control program that monitors the distance traveled by the movable surfaces 230 and as they approach the trays, the speed of the motor is changed or, in one embodiment, reduced to slow the speed at which the trays and semiconductor devices engage the interface 228. Alternatively, the motor speed may be controlled by a motor controller following a preprogrammed speed profile.

As the table 218 moves down, it also pushes components that are coupled to the under surface of the table 218, such as table output gear 408, downward. The table output gear 408 then engages a table spring 410. Thus, the table spring 410 is compressed and stores energy as the table 418 moves down and then stops. When the motor and gears are stopped and reversed, the threads 266 exert upward force on the thread pegs 264, and the mounting cylinder 254 is moved upward, away from the table 218. This relieves the force that is exerted on the bushing 256, and leads to a lack of downward force that keeps the table 218 moving downward or holding the table 218 in position. Thus, the table spring 410 begins releasing its energy and exerts upward force on the table output gear 408, pushing the table 218 upward in the process.

Upon the completion of testing, the movable surfaces 230 and press plates 232 are retracted away from the table 218 by reversing the rotation of the corresponding components of the shaft assembly 238. The threads 266 exert upward force on the thread pegs 264, and the mounting cylinder 254 is moved upward, away from the table 218. The movable surfaces 230 and the buffers 242 move in a direction opposite of the trays as a result. This relieves the force from the buffers on the semiconductor devices held in the trays. At the same time, as described above, the table spring 410 pushes the table upward, away from the interface 228. As the table moves, the trays come up under the semiconductor devices and the semiconductor devices rest in the cells of the trays.

Figure 12:
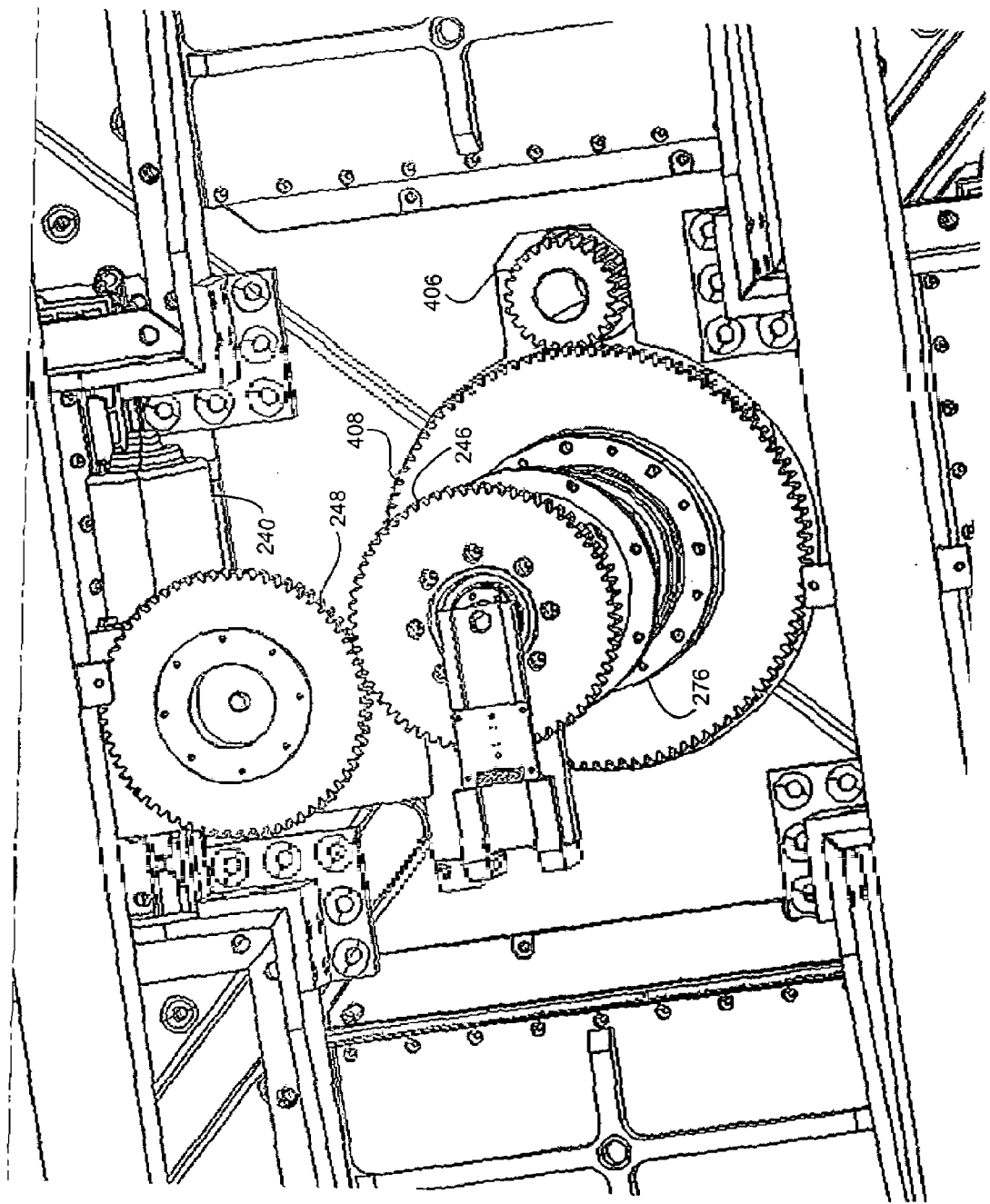
FIG. 12 illustrates top view of the shaft assembly and of components that reside under the table in accordance with some embodiments.
Figure 13:
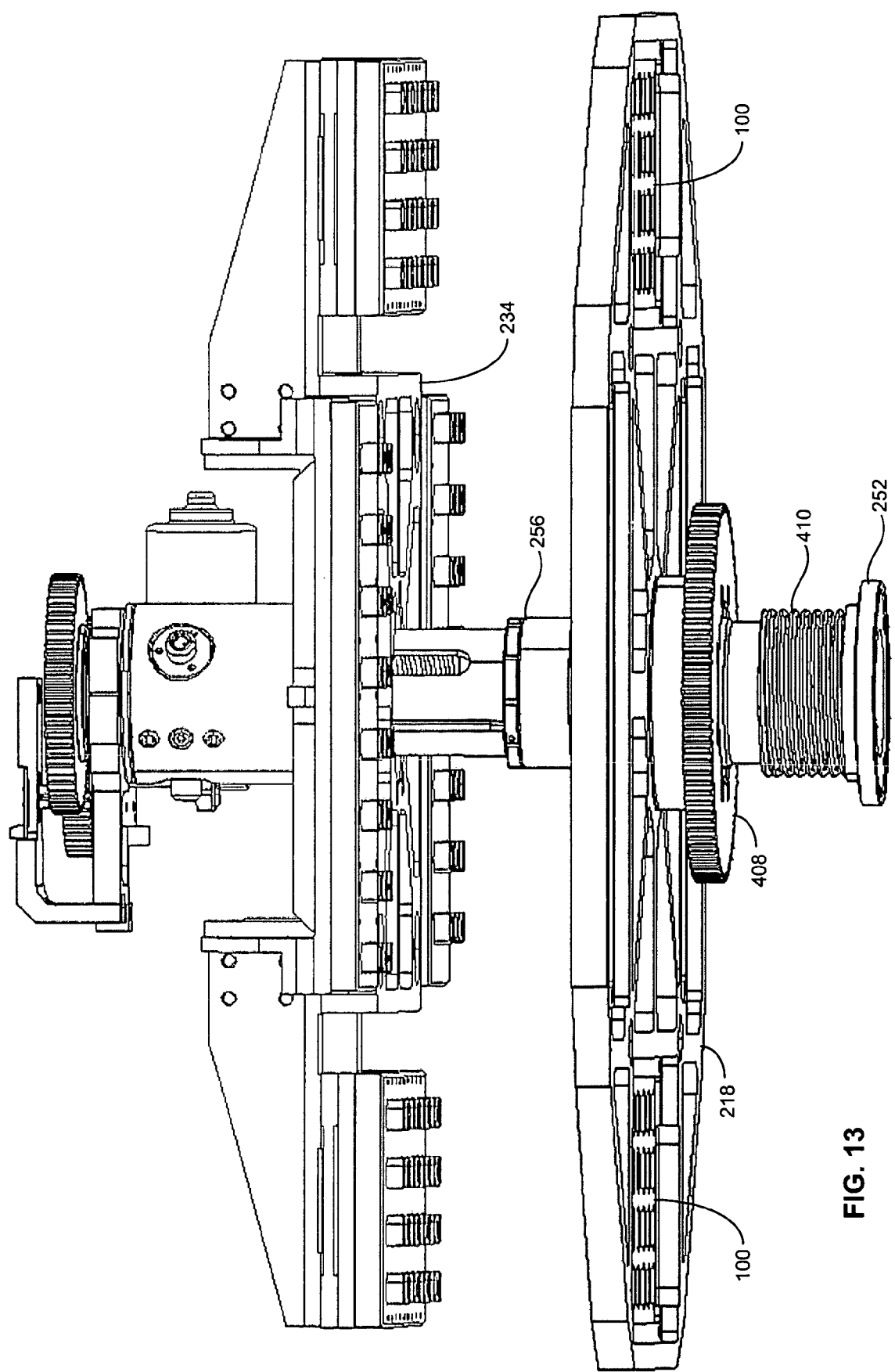
FIG. 13 illustrates a perspective view of the underside of the table in accordance with some embodiments.
Figure 14:
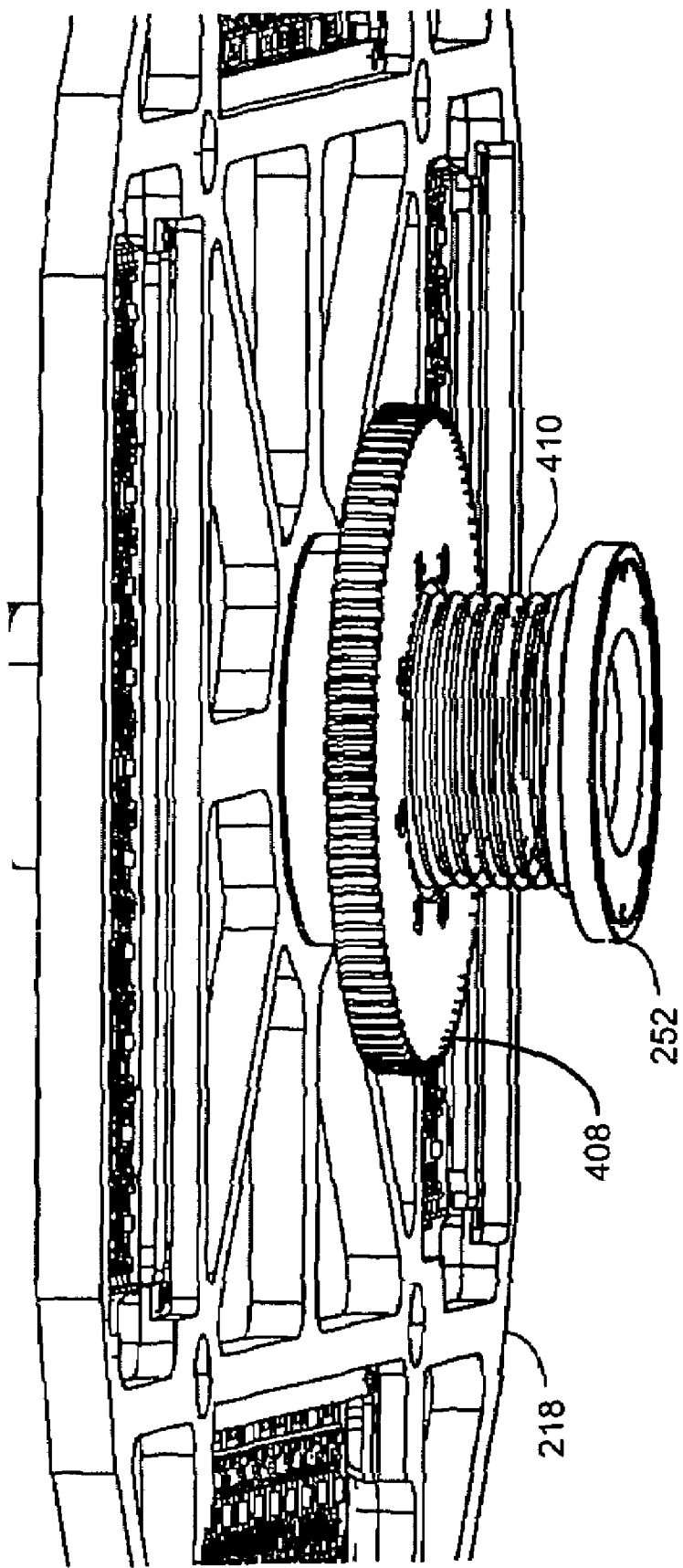
FIG. 14 illustrates a perspective view of the underside of the table in accordance with some embodiments.

As described above, a table motor 404 (FIG. 9) resides under the table 218. The table motor 404 rotates (e.g., via one or more cams) a table reduction gear 406 (FIG. 9, FIG. 12). The table reduction gear 406 drives a table output gear 408 (FIG. 12-14). The flange 276, which is coupled to the bushing 256, is mechanically coupled to the table output gear 408. Thus, rotation of the table output gear 408 also rotates the flange 276. The table 218, which is coupled to the flange 276, is rotated as a result of the rotation of the flange 276.

In operation, the table 218 may be rotated separately from the use of the shaft assembly. Rotation of the table 218 is used to move the trays and semiconductor devices from station to station within the apparatus 200. This allows, for example, one station to be used as the point at which trays are loaded and unloaded from the housing or chassis 202. It should be appreciated, however, that any station may be used as a location for loading and unloaded trays, provided there is adequate access via the housing or chassis 202, although a housing or chassis need not be used. In addition, rotation of the table 218 may be used to pass trays and the semiconductor devices therein to a different station for additional testing, which may include redundant testing or the performance of different tests using different test devices compared to the other stations.

Based on the foregoing, the apparatus 200 may be used in a process of securing semiconductor devices in place for testing and testing the semiconductor devices without removing them from the tray. A tray of semiconductor devices are placed in a receptacle for the tray, such as the receptacle on the table 218. The semiconductor devices contact an interface to test devices. Force is applied onto the semiconductor devices, securing the devices for testing. Once secured, tests may be performed on the semiconductor devices.

The apparatus 200 and its operation may be controlled manually or via software stored in a computer or firmware. The apparatus 200 may include buttons, switches, or other controls to provide manual control of operation (e.g., rotation of the table 218, movement of the table 218, and movement of the press plate 234). In some embodiments, controls for operations in the apparatus 200 may be included in software stored in a computer or firmware. The computer and the apparatus 200 may be connected by one or more signal lines. At the computer, a user may instruct the apparatus 200 to perform operations via the software, and the instructions are sent to the apparatus 200 from the computer via the signal lines. The apparatus 200 may also include both manual controls and control via computer software or firmware. In this case, the manual controls and the software controls may be duplicative of each other or may provide independent control over various functions and operations of the apparatus 200.

The apparatus 200 may also be used in conjunction with feeder or sorter systems. A feeder system or other tray transport device may automatically load trays into the apparatus 200 from a tray input/output system (not shown). While the testing or programming operation is being performed on the semiconductor devices by the apparatus 200, the sorter system (not shown) will sort the semiconductor devices from the input/output system into trays stacked, for example, by a plurality of tray elevators for each sorting category. In some other embodiments, semiconductor devices from the input/output system may be placed into tubes or cassettes that are organized and handled based on sorting categories.

The apparatus 200 supports temperature-controlled testing of semiconductor devices. Fans or air intake/outtake systems may be used to circulate temperature-controlled (heated and/or cooled) air into the first compartment 212, where the semiconductor devices are located. A thermostat may be used to monitor the temperature in the first compartment 212 and activate or deactivate air circulation as needed.

The foregoing description, for purpose of explanation, has been described with reference to specific embodiments. However, the illustrative discussions above are not intended to be exhaustive or to limit the scope of the claims to the precise forms or embodiments disclosed. Many modifications and variations are possible in view of the above teachings, and the embodiments described above are exemplary. For example, while the above embodiments are described in the context of using an SD card other semiconductor devices may be used. In addition, the above embodiments are described with the apparatus being oriented such that the shaft assembly is in a vertical position and the table and moving surface move in an up-and-down direction. It may be possible to shift the orientation of the apparatus 90° or 180° or to any other orientation. Furthermore, the components may be rearranged in accordance with the shift in orientation. For example, the apparatus may be arranged such that the trays of semiconductor devices are placed on the table, but the table remains stationary and the electrical contacts of the semiconductor devices are accessed from above rather than from below.

Accordingly, the embodiments were chosen and described to best explain the principles of the invention and its practical applications to thereby enable others skilled in the art to best utilize the invention and various embodiments with various modifications as are suited to the particular use contemplated. The above description, again, should not be viewed as limiting or as setting forth the only embodiments for making or using the apparatuses and methods described herein. Moreover, any headings used in the foregoing description are for convenience only and not intended to convey any limitation regarding the embodiments described under any such heading.

What is claimed is:

1. An apparatus for testing a plurality of semiconductor devices, comprising:
a body comprising a first member and a movable surface opposite said first member and configured to be movable toward and away from said first member;
said first member comprising a first surface opposite said movable surface, a receptacle portion, and a second surface opposite said first surface, wherein said first member defines at least one opening that extends through said first member from said first surface to said second surface;
said receptacle portion configured to receive a tray holding a plurality of semiconductor devices having exposed electrical contacts, such that the exposed electrical contacts of each of the semiconductor devices are accessible from said second surface of said first member through said at least one opening;
said movable surface comprising a plurality of extending members, each located at a predetermined position on said movable surface facing said first member, whereby when said movable surface is a predetermined distance from said first member each one of said extending members contacts a corresponding one of the semiconductor devices to secure its placement in the tray; and
an interface connected to said body, said interface comprising a first electrical interface configured for electrical connection to the exposed electrical contacts of each of the semiconductor devices and a second electrical interface electrically connected to said first electrical interface and having electrical contacts for connection to a test device, wherein said first electrical interface is separately removable from said interface.

2. The apparatus of claim 1, wherein said second electrical interface comprises a USB interface.

3. The apparatus of claim 1, wherein said interface further comprises an interface module configured to electrically couple said first electrical interface to said second electrical interface.

4. The apparatus of claim 3, wherein said first electrical interface comprises a first printed circuit board, a first set of electrical contacts configured to electrically couple the exposed electrical contacts of each of the semiconductor devices to said first printed circuit board and a second set of electrical contacts; and wherein said interface module comprises a second printed circuit board, a third set of electrical contacts electrically connected to said second electrical interface, and a fourth set of electrical contacts electrically connected to said second set of electrical contacts on said first printed circuit board.

5. The apparatus of claim 4, wherein said first set and said fourth set of electrical contacts comprise pogo pins.

6. The apparatus of claim 4, wherein an arrangement of said first set of electrical contacts is customized to the tray and to a type of the plurality of semiconductor devices.

7. The apparatus of claim 1, wherein said first member comprises a rotatable table.

8. The apparatus of claim 7, wherein said table is movable in a direction perpendicular to a plane of rotation of the table.

9. The apparatus of claim 7, wherein said rotatable table comprises a plurality of receptacle portions and defines a plurality of openings that each extend through said rotatable table from said first surface to said second surface; and wherein each of said receptacle portions is configured to receive a tray holding a plurality of semiconductor devices, each of the semiconductor devices having exposed electrical contacts, such that the exposed electrical contacts of each of the semiconductor devices would be adjacent to a corresponding one of said openings and accessible from said second surface of said rotatable table.

10. The apparatus of claim 1, wherein said body comprises a base for holding one or more test devices, wherein the test devices are configured to electrically connect to the plurality of semiconductor devices through the at least one opening.

11. The apparatus of claim 1, wherein said body further comprises:
a shaft assembly; and
a mounting plate coupled to said shaft assembly and to which said movable surface is mounted.

12. The apparatus of claim 11, wherein said shaft assembly comprises:
a rotatable shaft comprising one or more threads;
a mounting cylinder mechanically coupled to said threads and to which said mounting plate is mounted; and
a motor coupled to said rotatable shaft, whereby said motor rotates said rotatable shaft, thereby moving said mounting cylinder along said shaft and thereby moving said mounting plate and said movable surface in a direction parallel to the axis of rotation of said rotatable shaft.

13. The apparatus of claim 12, wherein said threads have a variable pitch.

14. The apparatus of claim 12, wherein said threads have a uniform pitch.

15. The apparatus of claim 12, wherein said shaft assembly further comprises an encoder configured to control rotation of said rotatable shaft.

16. The apparatus of claim 12, wherein said shaft assembly further comprises a guiding cylinder coupled to said mounting cylinder and configured to restrict rotation of said mounting cylinder, thereby restricting revolution of said movable surface around said shaft assembly.

17. The apparatus of claim 1, further comprising a housing that encloses said body.

18. The apparatus of claim 1, wherein the body further comprises:
a mounting plate to which said movable surface is mounted;
a rotatable shaft comprising one or more threads;
a mounting cylinder mechanically coupled to said threads and to which said mounting plate is mounted;
a motor coupled to said rotatable shaft, whereby said motor rotates said rotatable shaft, thereby moving said mounting cylinder along said shaft and thereby moving said mounting plate and said movable surface in a direction parallel to the axis of rotation of said rotatable shaft;
one or more test devices; and
wherein said first member comprises a rotatable table that comprises a plurality of receptacle portions and defines a plurality of openings that each extend through said rotatable table from said first surface to said second surface; and wherein each of said receptacle portions is configured to receive a tray holding a plurality of semiconductor devices, each of the semiconductor devices having exposed electrical contacts, such that the exposed electrical contacts of each of the semiconductor devices would be adjacent to a corresponding one of said openings and accessible from said second surface of said rotatable table.

19. The apparatus of claim 1, wherein said first member further defines a plurality of openings that each extend through said first member from said first surface to said second surface and further comprises a plurality of receptacle portions corresponding to each of said openings and each configured to receive a tray holding a plurality of semiconductor devices having exposed electrical contacts, such that the exposed electrical contacts of each of the semiconductor devices would be adjacent to one of said openings and accessible from said second surface of said first member; and
further comprising a plurality of movable surfaces, each positioned opposite said first member and opposite a corresponding one of said receptacle portions, each configured to be movable toward and away from said first member, and each comprising a plurality of extending members located at predetermined positions on said movable surface facing said first member, whereby when any one of said movable surfaces is a predetermined distance from said first member and a corresponding one of said receptacle portions, each one of said extending members of said one of said movable surfaces contacts a corresponding one of the semiconductor devices in a corresponding one of the trays to secure its placement in the tray.

20. An apparatus for testing a plurality of semiconductor devices, comprising:
a body comprising a first member, said first member comprising a first surface, an opposite second surface, and a plurality of receptacle portions disposed on said first surface, and defining a plurality of openings that extend through said first member from said first surface to said second surface, wherein each one of said openings is adjacent to one of said receptacle portions and wherein each of said receptacle portions is configured to receive a tray holding a plurality of semiconductor devices having exposed electrical contacts such that the exposed electrical contacts of each of the semiconductor devices are accessible from said second surface of said first member through one of said openings; and a plurality of interfaces, each one of said interfaces positioned adjacent to a corresponding one of said openings and each configured to provide an electrical connection between the electrical contacts of each of the semiconductor devices and a test device.

21. The apparatus of claim 20, wherein each of said interfaces comprises:

a first electrical interface having a first set of electrical contacts configured for electrical connection to the exposed electrical contacts of each of the semiconductor devices and having a second set of electrical contacts;

a second electrical interface having a first set of electrical contacts for electrical connection to said second set of electrical contacts of said first electrical interface and having a second set of electrical contacts for connection to a test device; and wherein said first electrical interface is separately removable from said interface.

22. The apparatus of claim 21, wherein said first member comprises a rotatable table.

23. An apparatus for testing a plurality of semiconductor devices, comprising:

a body comprising a first member, said first member comprising a first surface, an opposite second surface, and at least one receptacle portion disposed on said first surface, and defining at least one opening that extends through said first member from said first surface to said second surface, wherein said at least one receptacle portion is configured to receive a tray holding a plurality of semiconductor devices having exposed electrical contacts such that the exposed electrical contacts of each of the semiconductor devices are accessible from said second surface of said first member through said at least one opening; and an interface connected to said body, said interface comprising a first electrical interface having a first set of electrical contacts configured for electrical connection to the exposed electrical contacts of each of the semiconductor devices and having a second set of electrical contacts and a second electrical interface having a first set of electrical contacts for electrical connection to said second set of electrical contacts of said first electrical interface and having a second set of electrical contacts for connection to a test device, wherein said first electrical interface is separately removable from said interface.

24. The apparatus of claim 23, wherein said first member comprises a rotatable table.

* * * * *